(12) United States Patent
Lindsay et al.

(10) Patent No.: US 11,075,590 B1
(45) Date of Patent: Jul. 27, 2021

(54) METHODS AND SYSTEMS FOR ACTUATING ELECTROACTIVE MATERIALS

(71) Applicant: Facebook Technologies, LLC, Menlo Park, CA (US)

(72) Inventors: Jack Lindsay, Seattle, WA (US); Katherine Marie Smyth, Seattle, WA (US); Thomas John Farrell Wallin, Redmond, WA (US); Andrew John Ouderkirk, Redmond, WA (US); Tanya Malhotra, Redmond, WA (US); Austin Lane, Bellevue, WA (US); Christopher Yuan Ting Liao, Seattle, WA (US); Yigit Menguc, Kirkland, WA (US)

(73) Assignee: Facebook Technologies, LLC, Menlo Park, CA (US)

( * ) Notice: Subject to any disclaimer, the term of this patent is extended or adjusted under 35 U.S.C. 154(b) by 38 days.

(21) Appl. No.: 16/214,802

(22) Filed: Dec. 10, 2018

(51) Int. Cl.
*H02N 1/00* (2006.01)
*G02B 7/04* (2021.01)

(52) U.S. Cl.
CPC ............ *H02N 1/006* (2013.01); *G02B 7/04* (2013.01)

(58) Field of Classification Search
CPC ............ H01L 41/047; H01L 41/0472; H01L 41/0477; H01L 41/0478; H01L 41/083; H01L 41/183; H01L 41/193; H01L 41/22; G02B 2027/017; G02B 2027/0172; G02B 2027/0176; G02B 2027/0178; G02B 3/14; H02N 1/006
See application file for complete search history.

(56) References Cited

U.S. PATENT DOCUMENTS

2012/0306790 A1* 12/2012 Kyung .................... G06F 3/041
                                                          345/173
2017/0192595 A1* 7/2017 Choi ..................... G06F 3/0416

OTHER PUBLICATIONS

S. Rosset, M. Niklaus, P. Dubois, H.R. Shea, "Mechanical characterization of a dielectric elastomer microactuator with ion-implanted electrodes", Sensors and Actuators A 144 (2008) 185-193 (Year: 2008).*
Stacy Hunt, Thomas G. McKay, and Iain A. Anderson, "A self-healing dielectric elastomer actuator", Appl. Phys. Lett. 104, 113701 (2014) (Year: 2014).*

* cited by examiner

*Primary Examiner* — Mayla Gonzalez Ramos
(74) *Attorney, Agent, or Firm* — FisherBroyles, LLP

(57) ABSTRACT

In various embodiments, a method includes (1) applying a first voltage and a first current to an electroactive device that includes a nanovoided electroactive polymer, (2) measuring a second voltage and a second current associated with the electroactive device, (3) determining at least one of a position or a force output associated with the electroactive device, the position or the force based on the second voltage and the second current, and (4) applying a third voltage and a third current to the electroactive device based on the at least one of the position or the force output. Various other methods, systems, apparatuses, and materials are also disclosed.

20 Claims, 9 Drawing Sheets

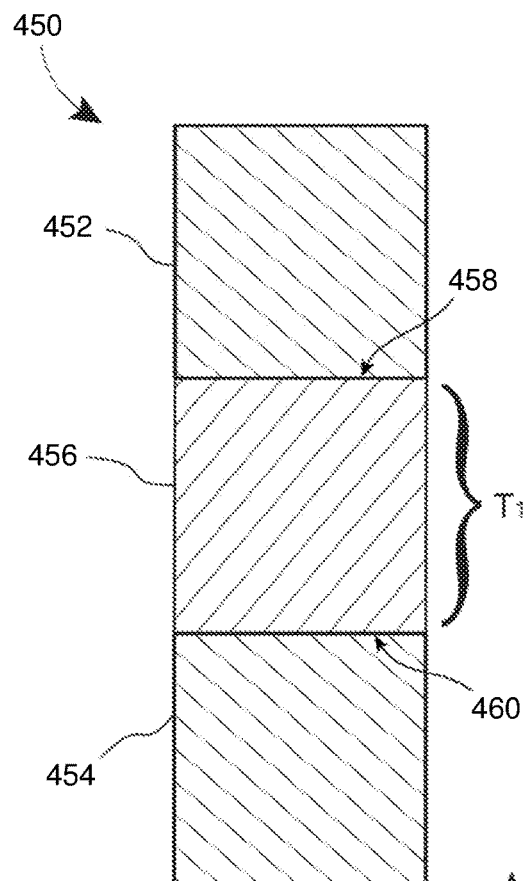
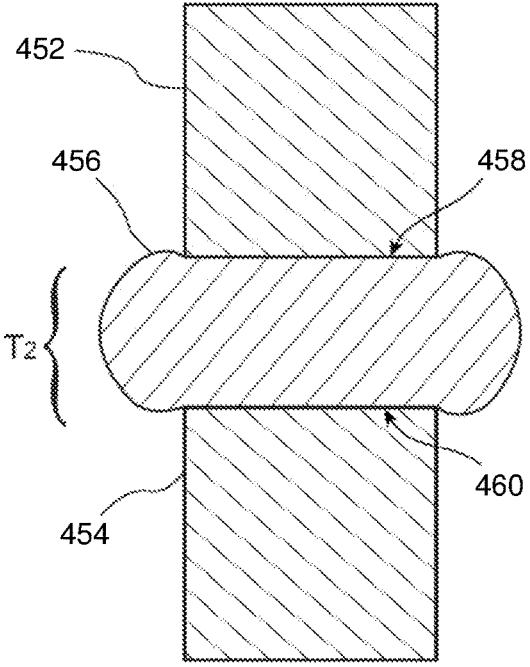
FIG. 4A
FIG. 4B

METHODS AND SYSTEMS FOR ACTUATING ELECTROACTIVE MATERIALS

BACKGROUND

Augmented reality (AR) and virtual reality (VR) eyewear devices or headsets may enable users to experience events, such as interacting with people in a computer-generated simulation of a three-dimensional world or viewing data superimposed on a real-world view. AR/VR eyewear devices and headsets may also be used for purposes other than recreation. For example, governments may use such devices for military training simulations, doctors may use such devices to practice surgery, and engineers may use such devices them as visualization aids.

AR/VR eyewear devices and headsets typically include some form of optical system or device, such as an optical lens assembly configured to focus or direct light from the device's display and/or the real world to the user's eyes. Thus, there is a need for improving such optical systems.

SUMMARY

As will be described in greater detail below, the instant disclosure describes systems, methods, and apparatuses for actuating electroactive materials.

In various embodiments, a method is described. The method may include (i) applying a first voltage and a first current to an electroactive device including a nanovoided electroactive polymer, (ii) measuring a second voltage and a second current associated with the electroactive device, (iii) determining at least one of a position or a force output associated with the electroactive device, the position or the force output being based on the second voltage and the second current, and (iv) applying a third voltage and a third current to the electroactive device based on the at least one of the position or the force output.

In one embodiment, determining at least one of a position or a force output associated with the electroactive device further may include determining a capacitance associated with the electroactive device based on the second voltage and the second current. In another embodiment, determining at least one of a position or a force output associated with the electroactive device further may include determining a parallel resistance or a series resistance associated with the electroactive device based on the second voltage and the second current.

In one embodiment, applying the second voltage and the second current to the electroactive device further may include (i) determining an error value associated with the position or a force output, (ii) determining at least one of a first signal proportional to the error value, a second signal based on an integral of the error value, or a third signal based on a derivative of the error value, and (iii) applying the third voltage and the third current based on at least one of the first signal, the second signal, or the third signal.

In another embodiment, the electroactive device may include a dielectric elastomer actuator. In one embodiment, the electroactive device may include a first electrode adjacent to a first surface of the nanovoided electroactive polymer and a second electrode adjacent to a second surface of the nanovoided electroactive polymer. In another embodiment, the nanovoided electroactive polymer may include a concentration of the nanovoids per unit volume that may be approximately 10% to approximately 90%. In one embodiment, the nanovoided electroactive polymer may include at least one of a polymer or an oxide.

In various embodiments, a method is described, the method including (i) applying a first voltage and a first current to an electroactive device including a nanovoided electroactive polymer, (ii) determining at least one of a position or a force output associated with the electroactive device, and (iii) applying a second voltage and a second current to the electroactive device based on the at least one of the position or the force output.

In one embodiment, determining the at least one of the position or the force output associated with the electroactive device further may include (i) determining at least one of a third voltage or a third current associated with a piezoelectric device electrically coupled to the electroactive device in circuit configuration having feedback, and (ii) determining the at least one of the position or the force output associated with the electroactive device based on the third voltage or the third current.

In another embodiment, applying the second voltage and the second current to the electroactive device further may include: (i) determining an error value associated with the position or a force output, (ii) determining at least one of a first signal proportional to the error value, a second signal based on an integral of the error value, or a third signal based on a derivative of the error value, and (iii) applying the second voltage and the second current to the electroactive device based on at least one of the first signal, the second signal, or the third signal.

In one embodiment, the electroactive device may include a dielectric elastomer actuator. In another embodiment, the electroactive device may include a first electrode adjacent to a first surface of the nanovoided electroactive polymer and a second electrode adjacent to a second surface of the nanovoided electroactive polymer. In one embodiment, the nanovoided electroactive polymer may include a concentration of the nanovoids per unit volume that may be approximately 10% to approximately 90%. In another embodiment, the nanovoided electroactive polymer may include a polymer or an oxide.

In various embodiments, a system is described, the system including an electroactive device including a nanovoided electroactive polymer, and a circuit configured to (i) apply a first voltage and a first current to the electroactive device, (ii) measure a second voltage and a second current associated with the electroactive device, (iii) determine at least one of a position or a force output associated with the electroactive device, the position or the force output being based on the second voltage and the second current, and (iv) apply a third voltage and a third current to the electroactive device. In one embodiment, the circuit being configured to determine the at least one of the position or the force output associated with the electroactive device may further include the circuit being configured to determine a capacitance associated with the electroactive device based on the second voltage and the second current.

In another embodiment, the electroactive device may include a dielectric elastomer actuator. In one embodiment, the electroactive device may include a first electrode adjacent to a first surface of the nanovoided electroactive polymer and a second electrode adjacent to a second surface of the nanovoided electroactive polymer. In another embodiment, the nanovoided electroactive polymer may include a concentration of the nanovoids per unit volume that may be approximately 10% to approximately 90%.

While the exemplary embodiments described herein are susceptible to various modifications and alternative forms, specific embodiments will be described in detail herein. However, the exemplary embodiments described herein are not intended to be limited to the particular forms disclosed. Rather, the instant disclosure covers all modifications, equivalents, and alternatives falling within this disclosure.

Features from any of the embodiments of the present disclosure may be used in combination with one another in accordance with the general principles described herein. These and other embodiments, features, and advantages will be more fully understood upon reading the following detailed description in conjunction with the accompanying drawings and claims.

BRIEF DESCRIPTION OF THE DRAWINGS

The accompanying drawings illustrate a number of exemplary embodiments and are a part of the specification. Together with the following description, these drawings demonstrate and explain various principles of the instant disclosure.

FIGS. 4A and 4B show diagrams of example electroactive devices, in accordance with one or more embodiments of the disclosure.

Figure 1:
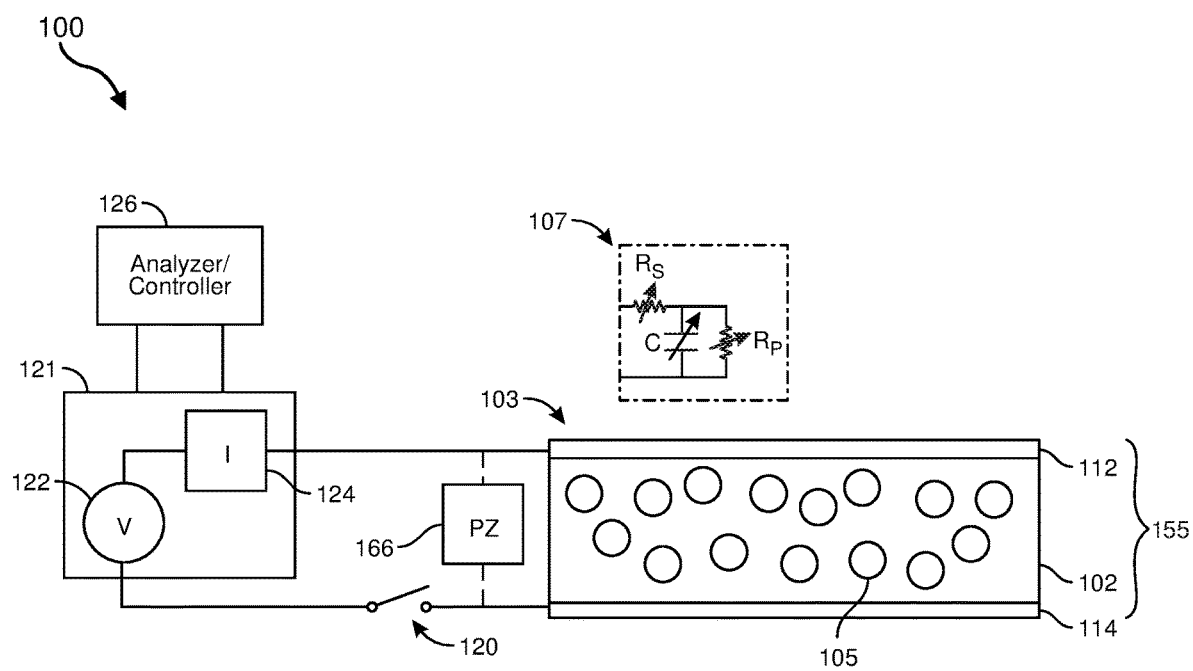
FIG. 1 shows an example diagram including a system for driving an electroactive device, in accordance with example embodiments of the disclosure.

Throughout the drawings, identical reference characters and descriptions indicate similar, but not necessarily identical, elements. While the exemplary embodiments described herein are susceptible to various modifications and alternative forms, specific embodiments have been shown by way of example in the drawings and will be described in detail herein. However, the exemplary embodiments described herein are not intended to be limited to the particular forms disclosed. Rather, the instant disclosure covers all modifications, equivalents, and alternatives falling within the scope of the appended claims.

DETAILED DESCRIPTION OF EXEMPLARY EMBODIMENTS

As will be explained in greater detail below, embodiments of the instant disclosure are generally directed to electrically driving electroactive devices and polymer materials, including nanovoided polymer materials, and methods and systems for the same.

In various embodiments, an electroactive device may refer to a device that may convert electrical energy to mechanical energy, the reverse, or both. In one embodiment, electroactive devices may be used as actuators and for sensing. In particular, actuators may convert electrical energy into mechanical energy, and similar or identical devices can be used to perform the reverse (i.e., convert mechanical energy to electrical energy). In one embodiment, actuators may include materials that are flexible and deformable, that can be deformed by forces and motions in the environment. Further, the response of an electroactive device to an input (e.g., a voltage or current) may change as the actuator deforms. Moreover, variation from manufacturing and/or from normal wear and tear may it difficult to determine the precise output of an electroactive device to a given input.

In various embodiments, feedback (e.g., closed-loop feedback) may be used to track the state (e.g., the shape and/or force output) of electroactive devices by monitoring one or more parameters associated with the electrical devices, the parameters including, but not limited to, a capacitance, a series resistance, a parallel resistance, combinations thereof, and/or the like. In another embodiment, the feedback can be provided by an external sensor or by the electroactive device itself, for example, via a self-sensing mechanism. In the case of self-sensing, the electroactive device may not require additional sensors as the electroactive device may track its state directly, which may lead to more compact and power-efficient system designs.

In another embodiment, the electroactive devices described herein may include an electrode material, which may alternatively or additionally, be referred to as an electrode, an electrode layer, a conductive material or layer, an electronically conductive material or layer and/or an electrode material or layer. In particular, an electrode material (or any of the synonymous terms above) may refer to a relatively thin and/or flexible electrically conductive material that may be electronically coupled to an electroactive material, discussed further below. The electrodes may be self-healing, such that when an area of an active layer (e.g., an electroactive material) of the electroactive device shorts out, the electrode may be able to isolate the damaged area.

In another embodiment, the electroactive devices described herein may include an electroactive material, which may alternatively or additionally be referred to as an electroactive polymer element, and/or an electroactive polymer herein. As used herein, electroactive materials may refer to materials that exhibit a change in size or shape when stimulated by an electric field. In another embodiment, an electroactive material may include a nanovoided material (e.g., a nanovoided polymer material), which may refer to a material having nano-sized voids, which may be referred to as nanovoids herein. In one embodiment, the voids may have a diameter of between approximately 10 nm and approximately 500 nm, for example, between approximately 50 nm and approximately 200 nm. In another example, the nanovoids may include closed-cell nanovoids, where gas-phase regions are isolated and surrounded by a polymer material. In one embodiment, the nanovoids may be include open-cell nanovoids where gas phase regions are connected to other gas phase regions in the electroactive material.

In an aspect, feedback (e.g., closed loop feedback) control may refer to techniques using one or more sensors (which may, in some embodiments, include the electroactive device itself) to determine the state (e.g., shape or force output) of an electroactive device by measuring one or more parameters (e.g., voltage, current, capacitance, resistance, and the like) associated with the electroactive device, and adjusting the voltage or current into the electroactive device as a result of the measurement.

Figure 12:
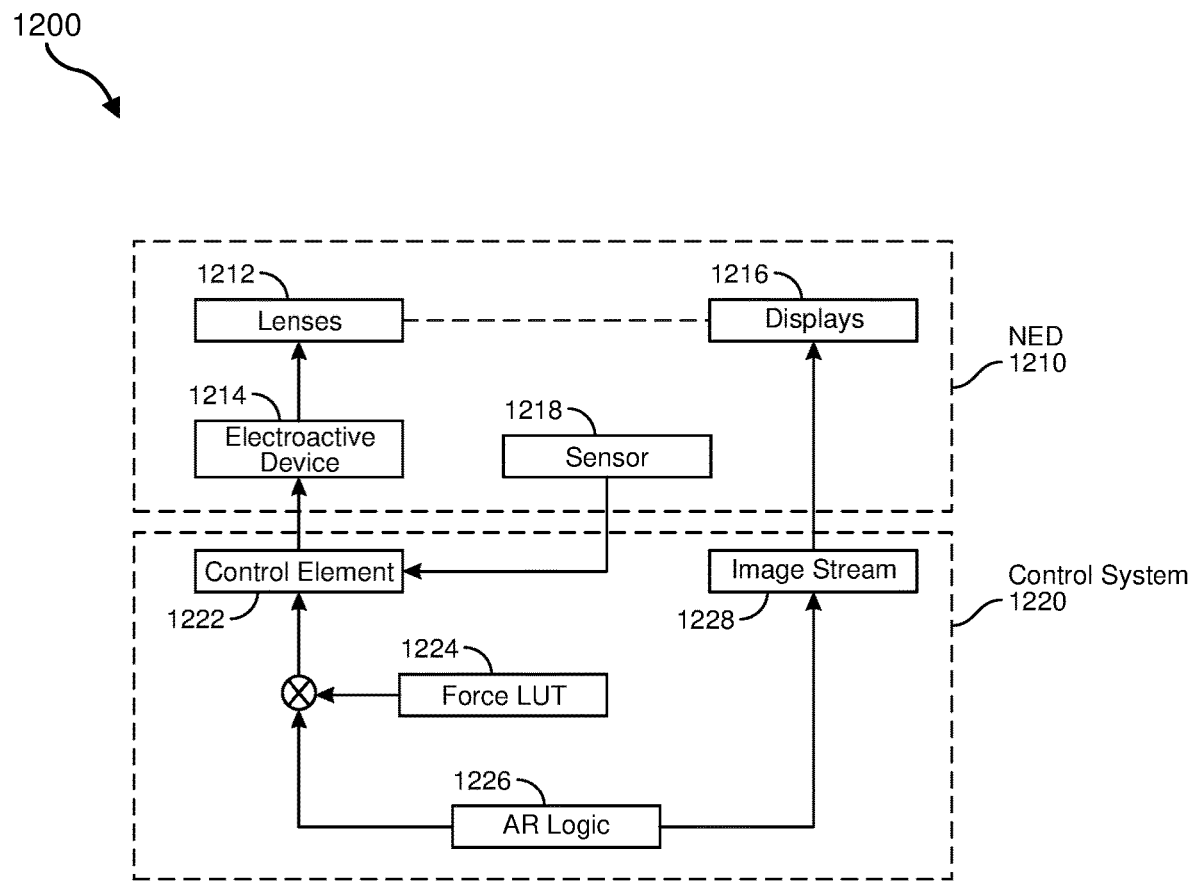
FIG. 12 shows a diagram of an example control system for controlling aspects of the various electroactive devices described herein, in accordance with example embodiments of the disclosure.
Figure 13:
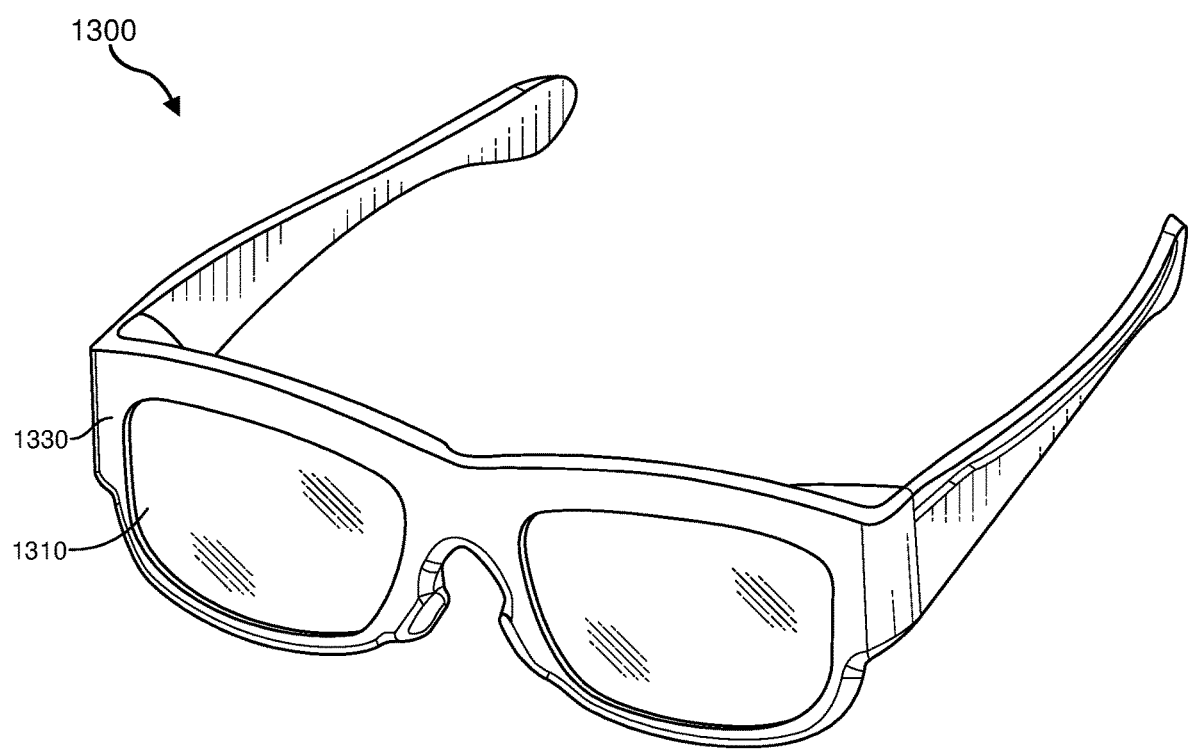
FIG. 13 shows a diagram of an example head mounted device (HMD), in accordance with example embodiments of the disclosure.

The following will provide, with reference to FIGS. 1-13, detailed descriptions of systems, methods, and apparatuses for actuating electroactive devices. The discussion associated with FIGS. 1-4 includes descriptions of electroactive device structures, controlling circuitry, and nanovoided material structure, in accordance with various embodiments. The discussion relating to the embodiments depicted in FIGS. 5-6 include descriptions of different electroactive device structures (e.g., planar and radial structures), in accordance with example embodiments of the disclosure. The discussion associated with FIG. 7 describes an example method of driving the electroactive devices described herein, in accordance with example embodiments of the disclosure. The discussion relating to the embodiments depicted in FIGS. 8-9 includes descriptions of example deformable element (e.g., liquid lens) designs and devices incorporating the electroactive devices. The discussion relating to the embodiments depicted in FIGS. 10-11 includes lens assembly devices including the electroactive devices. The discussion relating to the embodiment depicted in FIG. 12 shows a diagram for a near-eye display and control system, in accordance with embodiments of the disclosure. The discussion relating to the embodiment depicted in FIG. 13 shows an example of a near-eye-display having lenses that may be actuated with the electroactive devices. While many of the examples discussed herein may be directed to HMD systems, embodiments of the instant disclosure may be implemented in a variety of different types of devices and systems.

FIG. 1 shows an example diagram including a system for driving an electroactive device, in accordance with example embodiments of the disclosure. In particular, diagram 100 shows an example electroactive device 103; further, the electroactive device 103 may serve as an actuator. Further, the electroactive device 103 may include at least one electroactive material, such as electroactive material 102. In particular, electroactive material 102 may be deformable upon the application of a voltage (e.g., by a power source 121, to be discussed below). Further, electroactive device 103 may include a stack 155 of materials including a first electrode 112 and a second electrode 114, and the electroactive material 102 may include a nanovoided polymer material that may be interposed between at least a portion of the area of the first electrode 112 and the second electrode 114.

In another embodiment, the state (e.g., the shape and/or force output) of the electroactive device 103 may be tracked by one or more systems using feedback (e.g., closed-loop feedback) control using an analyzer/controller 126, to be described further below. In another embodiment, the tracking of the state of the electroactive device 103 may be performed by an external sensor such as sensor 166, or by sensing a parameter of the electroactive material (e.g., capacitance, resistance, inductance, combinations thereof, and/or the like), or both. In one embodiment, the electroactive material 102 may be between approximately 100 nm and approximately 10 µm thick. In another embodiment, the first electrode 112 and second electrode 114 may be between approximately 10 nm to approximately 1000 nm thick. In one embodiment, the electroactive material 102 may include a thermoset polymer material having an elastic modulus of less than approximately 10 giga-Pascals, GPa (alternatively, less than approximately 1 GPa, or less than approximately 0.5 GPa).

In one embodiment, the electroactive device 103 may be represented as an equivalent circuit 107. The equivalent circuit 107 may include parameters such as a series resistance component, a capacitance component, and/or a parallel resistance component, combinations thereof, and/or the like. In another embodiment, the analyzer/controller 126 may be used to determine the various parameters above, for example, by performing a calculation on measured output voltages and output currents of the electroactive device 103 for given input voltages and input currents, as applied, for example, by a power source 121, to be discussed.

As shown in this figure, the electroactive device 103 may be coupled to the power source 121. In another embodiment, the power source 121 may include a voltage source 122 and a current source 124 and may be connected to the electroactive device 103 via a switch 120. In some embodiments, the voltage source 122 may refer to a two-terminal device which may maintain a fixed voltage in an electronic circuit. In some embodiments, the current source 124 may refer to a two-terminal device which may deliver an electric current to a portion of the electronic circuit (e.g., the electroactive device 103), and which is independent of the voltage across the current source 124. In another embodiment, the switch 120 may be open or closed; in the closed case, the switch 120 may permit the current source 124 to deliver current to the electroactive device 103.

In another embodiment, the power source 121 may be connected to an analyzer/controller 126. The analyzer/controller 126 may be configured to control the power source 121, for example, by sending and receiving one or more electric signals to the analyzer/controller 126. In another embodiment, the analyzer/controller 126 may thereby be able to measure the state (e.g., a shape or force output) of the electroactive device 103, at least because the state of the electroactive device 103 may correlate with the measured voltages and/or currents that are determined by the analyzer/controller 126 in combination with the power source 121 and the electroactive device 103 circuit. Further, based on the difference between a given state of the electroactive device 103 and a given set-point (e.g., a predetermined state for the electroactive device 103), the analyzer/controller 126 may be configured to modify the voltage output of the voltage source 122 and/or the current output of the current source 124 of the power source 121 applied to the electroactive device 103 after measurement of the voltages and/or currents. Accordingly, the analyzer/controller 126 may be able to control a future state of the electroactive device 103 based at least in part on a current state or a past state of the electroactive device 103. In another embodiment, the analyzer/controller 126 may include a dosed loop controller, which may have a feedback loop which to ensure that the analyzer/controller 126 exerts a control action to control a process variable (e.g., voltage and/or current applied to the electroactive device 103) at a value corresponding to the setpoint.

In another embodiment, the analyzer/controller 126 may include a proportional-integral-derivative controller (PID controller), which may refer to a controller that may use a control loop feedback mechanism for providing continuously modulated control of the electroactive device 103. In one embodiment, the PID controller may continuously calculate an error value over time, e(t), as the difference between a given setpoint (SP) and a measured process variable (PV, e.g., a voltage, a current, a capacitance, a resistance, any quantities derived from such process variables including a state and/or shape of the electronic device 103, combinations thereof, and/or the like). The PID controller may then apply a second signal (e.g., a correction signal) including a second voltage and/or current to the electroactive device 103, the second signal determined based at least in part on the proportional, integral, and derivative terms (denoted P, I, and D respectively). Further, the analyzer/controller 126 may serve to minimize the error over time by adjustment of one or more control variables (e.g., voltage, current, or both) to new values as determined, for example, by a weighted sum of the control terms.

In one embodiment, the proportional term P may be proportional to the value of the SP-PV error, e(t). For example, if the error is relatively large and positive, the control output may be proportionately large and positive, which may be reflected by a gain factor, K of the PID control. In another embodiment, using proportional control alone may result in an error between the setpoint and the actual process value, for example, because the analyzer/controller 126 may require an error to generate the proportional response. If there is no error at a given time interval, there may not be a corrective response in the form of an applied voltage and/or current to the electroactive device 103, even if the error may be generated over previous durations of time. Accordingly, the analyzer/controller 126 may use additional control mechanisms in addition to proportional control so ensure an appropriate corrective response.

In another embodiment, the integral term I may account for past values of the SP-PV error and may integrate the past values over time to produce an integral (I) component of an applied signal to the electroactive device 103. For example, if there is a residual SP-PV error after the application of proportional control, P, the integral term I may reduce the residual error by adding a control effect due to the historical cumulative value of the error. In another embodiment, if the error is eliminated, the integral term may cease to grow or have reduced growth. Accordingly, the proportional component of the corrective response may diminish as the error decreases, but this may be compensated for by the growing integral component of the corrective response generated by the analyzer/controller 126.

In another embodiment, the differential term D may represent a best estimate of the future trend of the SP-PV error, based on the error's rate of change in the present time step. In one embodiment, the D term may effectively reduce the effect of the SP-PV error by exerting, via the analyzer/controller 126, a corrective response signal to the electroactive device 103 generated by the rate of error change. The more rapid the change, the greater the controlling effect on the electroactive device 103.

Accordingly, the P, I, and D terms of a PID control mechanism in an example embodiment of an analyzer/controller 126 may be dynamically tuned to provide optimal control of the electroactive device 103. Tuning may, in the context of providing control signals to an electroactive device 103 via an analyzer/controller 126, refer to determining a relative proportion of the various effects of the P, I, and D terms described above to implement efficient control of the electroactive device 103. Further, tuning may be achieved using feedback to produce the optimal control function. In particular, the tuning of the P, I, and D terms may depend on the response characteristics of a complete feedback loop external to the analyzer/controller 126. Further, the tuning of the P, I, and D terms may be dependent on the behavior of the measuring sensor (e.g., the analyzer/controller 126 and/or an external sensor such as sensor 166), the final control element (e.g., the electroactive device 103), and/or any control signal delays and limitations. Approximate values of the tuning parameters associated with the P I, and D terms may be initialized using any suitable method; the P, I, and D terms but may be refined by bumping the process in practice by introducing a setpoint change and observing the system response e.g., the change of state) of the electroactive device 103.

In one embodiment, tuning a control loop (e.g., the control loop represented by the circuit including the analyzer/controller 126, the power source 121, the electroactive device 103, and/or the sensor 166) may refer to the adjustment of one or more control parameters (e.g., one or more of (i) a band and/or gain associated with the proportional term, (ii) a gain and/or reset associated with integral term, and/or (iii) a gain and/or rate associated with the differential term of a PID control mechanism of the analyzer/controller 126) to optimum values for the a desired control response (e.g., a given state of the electroactive device 103). In another embodiment, the tuning of such a control loop may be performed while maintaining stability (e.g., the prevention of unbounded oscillations in the state of the electroactive device 103).

In various embodiments, although the analyzer/controller 126 including a PID control mechanism may have three control terms (e.g., P, I, and D), only one or two terms may be used to provide the appropriate control of the state of the electroactive device 103. In another embodiment, such control may be achieved by setting the unused parameters to zero, and the type of control may, therefore, be referred to as PI, PD, P or I control in the absence of the other control actions. In one embodiment, a PI control may be used, since derivative action may be sensitive to measurement noise, whereas the absence of an integral term may prevent the system from reaching its target state of the electroactive device 103.

In various embodiments, diagram 101 further shows a sensor 166, which may be used to at least partially determine the state of the electroactive device 103. In particular, one or more parameters of the sensor 166 may change in response to changes in the state of the electroactive device 103. In an embodiment, the sensor 166 may include a piezoelectric sensor. In another embodiment, a piezoelectric sensor may include a piezoelectric material that may be configured to operate in three operational modes: a transverse operational mode, a longitudinal operational mode, and/or a shear operational mode. Such operational modes may be triggered and correlated with changes in the state (e.g., the shape and/or the force output) of the electroactive device 103.

In one embodiment, the piezoelectric sensor may be configured to operate in a traverse operational mode, where the transverse operational mode may refer to a case where the piezoelectric material experiences a force applied along a neutral axis (e.g., a y-axis) direction of the piezoelectric material, and the force displaces charges along an orthogonal axis (e.g., an x-axis) direction of the piezoelectric material, perpendicular to the line of force. In one embodiment, the amount of charge along the orthogonal axis (e.g., x-axis) may depend on the geometrical dimensions of the respective piezoelectric element and the piezoelectric coefficient of the piezoelectric material, which may change as a result of changes in the deformation of the electroactive material 102 of the electroactive device 103.

In one embodiment, the piezoelectric sensor may be configured to operate in a longitudinal operational mode, where the longitudinal operational mode may refer to a case where the amount of charge displaced in the piezoelectric material is proportional to the applied force and may be independent of the piezoelectric material's geometry (e.g., the size and shape of the piezoelectric material). Further, the amount of displaced charge may change as a result of changes in the deformation of the electroactive material 102 of the electroactive device 103. In one embodiment, several piezoelectric materials may be positioned mechanically in series and electrically in parallel with respect to the electroactive device 103, for example, in order to increase the charge output from the piezoelectric sensor responsive to changes in the state of the electroactive device 103.

In one embodiment, the piezoelectric sensor may be configured to operate in a shear operational mode, where the shear operational mode may refer to a case where the charges produced by a piezoelectric material of the piezoelectric sensor may be proportional to the applied forces and may be independent of the piezoelectric material's geometry (e.g., the size and shape of the piezoelectric material). Further, the charges produced may change as a result of changes in the deformation of the electroactive material 102 of the electroactive device 103.

In various embodiments, the sensor 166 may include a piezoelectric sensor including any suitable material. In another embodiment, the piezoelectric sensors may include materials such as piezoelectric ceramics and single crystal materials. In one embodiment, the ceramic materials (such as lead zirconate titanate (PZT) ceramic) may have a piezoelectric constant/sensitivity that may be approximately two orders of magnitude higher than those of the natural single crystal materials. In another embodiment, the piezoelectric effect in suitable piezoceramics may have a high sensitivity that degrades overtime. In one embodiment, materials may be used that are less-sensitive, natural, and single-crystal materials (e.g., gallium phosphate, quartz, tourmaline). Such materials may have a relatively high long-term stability, which may be more suitable for certain implementations used in connection with the electroactive device 103.

In various embodiments, the piezoelectric sensors may include materials that include, but are not limited to, quartz, berlinite ($AlPO_4$), a Rochelle salt, topaz, tourmaline-group minerals, lead titanate ($PbTiO_3$), combinations thereof, and/or the like. In another embodiment, the piezoelectric materials may include ceramics with randomly oriented grains, such as in textured polycrystalline non-ferroelectric piezoelectric materials (e.g., as aluminum indium nitride (AlN) and zinc oxide (ZnO)). In one embodiment, the piezoelectric material may include, but not be limited to, the family of ceramics with perovskite, tungsten-bronze and related structures exhibiting piezoelectricity. Non-limiting examples may include barium titanate ($BaTiO_3$), lead zirconate titanate ($Pb[Zr_xTi_{1-x}]O_3$ with $0 \le x \le 1$)—which may be referred to as PZT, potassium niobate ($KNbO_3$), sodium tungstate ($Na_2WO_3$), $Ba_2NaNb_5O_5$, $Pb_2KNb_5O_{15}$, combinations thereof, or the like. In one embodiment, the piezoelectric material may include, but not be limited to, polymers, such as polyvinylidene fluoride (PVDF).

In some embodiments, electroactive devices 103 (e.g., actuators) may be fabricated with one or more steps including (1) providing a first conductive layer (e.g., a first electrode 112), (2) applying a mixture of curable material (e.g., a monomer, reactive materials, or an oligomer that forms covalent, ionic, hydrogen, or Van der Waals bonds) and non-curable material(s) (e.g., a non-reacting solvent and/or cavitation agent), (3) at least partially curing the curable material, (4) removing at least a portion of the non-curable material (e.g., the solvent), and (5) applying a second conductive layer (e.g., a second electrode 114). In another embodiment, steps (2)-(4) may be performed in order to fabricate the electroactive material 102 of the electroactive device 103. Further, the curable material may be soluble in the non-curable material (e.g., the solvent) and the at least partially cured material may not be completely soluble in the non-curable material, leading to the formation of nanovoids upon processing (e.g., curing, removing the portion of the non-curable material).

In some embodiments, a curable material for use in fabricating the electroactive material 102 may include a silicone resin, such as, for example, polydimethylsiloxane (PDMS). In another embodiment, if the curable material is PDMS, then cavitation agent may include a thermal or an ultra-violet (UV) initiated hydrosilation catalyst. Suitable hydrosilation catalysts may include, but not be limited to, bis(acetylacetonate)platinum II, n(2-cyclopentadienyl) trialkylplatinum, and the like. Additionally, or alternatively, the curable material may include, but not be limited to, acrylates, styrenes, polyesters, polycarbonates, epoxies, combinations thereof, and/or the like.

In one embodiment, the mixture of the curable material and the non-curable material, the first conductive material, and the second conductive material (and any additional materials and layers) may be disposed (e.g., on a substrate) in any suitable manner for fabricating the electroactive device 103. A "substrate," as used herein, may generally refer to any material (e.g., a layer) on which another layer or element is formed. In another embodiment, such material may be printed (e.g., via inkjet printing, silkscreen printing, etc.). In some aspects, inkjet printing can refer to a type of computer printing that operates by propelling droplets of material onto a substrate (e.g., a flexible or inflexible substrate). In other aspects, silkscreen printing can refer to a printing technique whereby a mesh is used to transfer a material (e.g., curable material and/or non-curable material) onto a substrate (e.g., a flexible or inflexible substrate), except in areas made impermeable to the material by a blocking stencil. A blade or squeegee may be moved across the screen to fill the open mesh apertures with the material, and a reverse stroke then causes the screen to touch the substrate momentarily along a line of contact. This causes the material to wet the substrate and be pulled out of the mesh apertures as the screen springs back after the blade has passed. In one embodiment, the materials may be vaporized (e.g., via thermal evaporation, chemical vapor deposition (CVD), physical vapor deposition (PVD), and the like). In another embodiment, the materials may be disposed using a co-flow process and/or a roll-to-roll process. In some embodiments, monomers, oligomers, and/or prepolymers for forming electroactive polymer materials may optionally be mixed with a solvent and the solvent may be removed from the electroactive polymer element during and/or following curing to form nanovoids within the electroactive polymer element.

In various embodiments, methods of forming an electroactive device 103 may include forming electrode materials and electroactive materials sequentially (e.g., via vapor deposition, coating, printing, etc.) or simultaneously (e.g., via co-flowing, coextrusion, slot die coating, etc.). Alternatively, the electroactive materials may be deposited using initiated chemical vapor deposition (iCVD), where, for example, suitable monomers of the desired polymers may be used to form the desired coating. In some embodiments, monomers, oligomers, prepolymers, and/or polymers for forming the electroactive polymer may optionally be mixed to form a mixture with a solvent, and the solvent may be removed from the electroactive polymer during and/or following curing to form nanovoids within the electroactive polymer.

In at least one embodiment, the mixture may contain at least an average of approximately 10% by weight of solvent (e.g., approximately 20%, approximately 30%, approximately 50%, and the like). In another embodiment, the curable material may be cured in any suitable manner, for example, by using a source of actinic energy. In another embodiment, actinic energy may include, but not be limited to, x-rays, ultraviolet radiation, beams, and/or the like. The curing process may also be initiated by, for example, remotely forming the free-radical initiator and bringing that in contact with the curable material. Further, for a multilayer electroactive device including multiple electroactive materials (shown and described in connection with FIG. 3, below) may be fabricated using multiple applications of the mixture of curable material and non-curable material; further, the multilayer may be cured sequentially (e.g., between the application of the individual layers), or a once (e.g., at the end of the deposition of the multilayer).

According to various embodiments, the electroactive device 103 may be used to actuate deformable optical elements in optical assemblies (e.g., lens systems), to be described further in connection with FIGS. 8-11, below. As noted, the electroactive device 103 may convert electrical energy to mechanical energy (e.g., an actuator), but may also be configured to convert mechanical energy to electrical energy (e.g., an energy harvesting device). Examples of electroactive devices 103 may include, without limitation, actuators, sensors, microelectromechanical devices, and/or any other suitable devices.

As noted, in various embodiments, electroactive devices may include paired electrodes such as first electrode 112 and second electrode 114, which may allow the creation of the electrostatic field that forces constriction of the electroactive material 102. Such electrodes may include relatively thin, electrically conductive layers or elements and may be of a non-compliant or compliant nature. Any suitable materials may be utilized in the electrodes, including electrically conductive materials suitable for use in thin-film electrodes, such as, for example, aluminum, transparent conductive oxides, silver, indium, gallium, zinc, carbon nanotubes, carbon black, and/or any other suitable materials formed by vacuum deposition, spray, adhesion, and/or any other suitable technique either on a non-electroactive polymer layer or directly on the electroactive polymer surface itself. In some embodiments, the electrodes may be self-healing, such that damage from local shorting of a circuit can be isolated. Suitable self-healing electrodes may include thin films of metals, such as, for example, aluminum.

In some embodiments, electroactive materials 102 including electroactive polymers may find limited applications due to a low breakdown voltage of the polymers with respect to the operating voltage used by electroactive devices (e.g., actuators) that use the polymers. Accordingly, an electroactive device 103 with reduced operating voltages and higher energy densities may be useful for many applications. In some examples, an electroactive polymer may include a deformable polymer that may be symmetric with respect to electrical charge (e.g., polydimethylsiloxane (PDMS) acrylates, etc.) or asymmetric (e.g., poled polyvinylidene fluoride (PVDF) or its copolymers such as poly[vinylidenefluoride-co-trifluoroethylene] (PVDF-TrFE)).

Additional examples of polymer materials forming electroactive polymer materials for use in the electroactive device 103 may include, without limitation, styrenes, polyesters, polycarbonates, epoxies, halogenated polymers, such as PVDF, copolymers of PVDF, such as PVDF-TrFE, silicone polymers, combinations thereof, and/or any other suitable polymer materials. Such materials may have any suitable dielectric constant or relative permittivity, such as, for example, a dielectric constant ranging from approximately 1.2 to approximately 30.

In the presence of an electrostatic field, an electroactive material 102 including an electroactive polymer may deform (e.g., compress, elongate, bend, etc.) according to the strength of that field. Generation of such a field may be accomplished, for example, by placing the electroactive polymer between the electrodes 112 and 114, each of which may be at a different potential. As the potential difference (i.e., voltage difference) between the electrodes 112 and 114 is increased (e.g., from zero potential) the amount of deformation may also increase, principally along electric field lines. This deformation may achieve saturation when a certain electrostatic field strength has been reached. With no electrostatic field, the electroactive material 102 (e.g., electroactive polymer) may be in its relaxed state undergoing no induced deformation, or stated equivalently, no induced strain, either internal or external.

The physical origin of the compressive nature of electroactive material 102 (e.g., electroactive polymer) in the presence of an electrostatic field (E-field), being the force created between opposite electric charges, may be that of the Maxwell stress, which is expressed mathematically with the Maxwell stress tensor. The level of strain or deformation induced by a given E-field may be dependent on one or more of the square of the E-field strength, the dielectric constant of the electroactive material 102, and on the elastic compliance of the electroactive material 102. Compliance in this case may refer to the change of strain of the electroactive material 102 with respect to stress or, equivalently, in more practical terms, the change in displacement of the electroactive material 102 with respect to force.

The methods and systems shown and described herein may be used in connection with electroactive devices having multiple layers (e.g., a few layers to tens, hundreds, or thousands of stacked layers), as shown and described, for example, in connection with FIG. 3, below. For example, an electroactive device may include a stack of from two electroactive polymer elements and corresponding electrodes to thousands of electroactive polymer elements (e.g., from 2 electroactive polymer elements to approximately 5, approximately 10, approximately 20, approximately 30, approximately 40, approximately 50, approximately 100, approximately 200, approximately 300, approximately 400, approximately 500, approximately 600, approximately 700, approximately 800, approximately 900, approximately 1000, approximately 2000, greater than approximately 2000 electroactive polymer elements).

As noted, the electroactive device 103 may include at least a first electrode 112 and second electrode 114. Further, an electroactive material 102 having nanovoids (e.g., a nanovoided polymer) may be disposed between the first electrode 112 and the second electrode 114. In some embodiments, the electroactive material 102 may include a nanovoided polymer material that may further include particles of a material with a high dielectric constant (e.g., barium titanate). The particles may have an average diameter of between approximately 10 and approximately 1000 nm (e.g., between approximately 10 and approximately 100 nm, between approximately 20 and approximately 100 nm, and the like).

Figure 2:
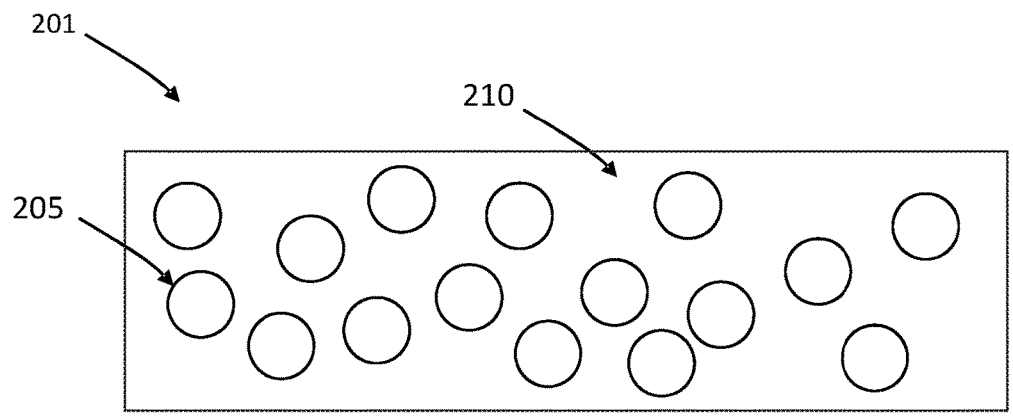
FIG. 2 shows a diagram of an example nanovoided material, in accordance with example embodiments of the disclosure.

FIG. 2 shows a diagram of an example nanovoided material, in accordance with example embodiments of the disclosure. In particular, diagram 200 in FIG. 2 illustrates aspects of the formation of nanovoids in a material 210 (e.g., a polymer), in accordance with example embodiments of the disclosure. In some embodiments, the nanovoided material 210 may be included in the electroactive device 103 of FIG. 1 above (e.g., used as the electroactive material 102 of FIG. 1). In another embodiment, a material precursor such as a monomer may be deposited with a solvent, and the monomer and solvent may be cured leading to the separation of the solvent and the formation of the nanovoids 205 in the nanovoided material 210.

In some embodiments, the nanovoids 205 may occupy at least approximately 10% (e.g., approximately 10% by volume, approximately 20% by volume, approximately 30% by volume, approximately 40% by volume, approximately 50% by volume, approximately 60% by volume, approximately 70% by volume, approximately 80% by volume, approximately 90% by volume) of the volume of the nanovoided material 210. The voids and/or nanovoids may be either closed- or open-celled, or a mixture thereof. If they are open-celled, the void size may be the minimum average diameter of the cell. In some embodiments, the nanovoided material 210 may include a thermoset material and/or any other suitable material.

The voids and/or nanovoids 205 may be any suitable size and, in some embodiments, the voids may approach the scale of the thickness of the nanovoided material 210. For example, the voids may be between approximately 10 nm to about equal to the thickness of the nanovoided material 210. In some embodiments, the voids may be between approximately 10 nm and approximately 1000 nm (e.g., approximately 10 nm, approximately 20 nm, approximately 30 nm, approximately 40 nm, approximately 50 nm, approximately 60 nm, approximately 70 nm, approximately 80 nm, approximately 90 nm, approximately 100 nm, approximately 110 nm, approximately 120 nm, approximately 130 nm, approximately 140 nm, approximately 150 nm, approximately 160 nm, approximately 170 nm, approximately 180 nm, approximately 190 nm, approximately 200 nm, approximately 250 nm, approximately 300 nm, approximately 400 nm, approximately 500 nm, approximately 600 nm, approximately 700 nm, approximately 800 nm, approximately 900 nm, approximately 1000 nm).

Figure 3:
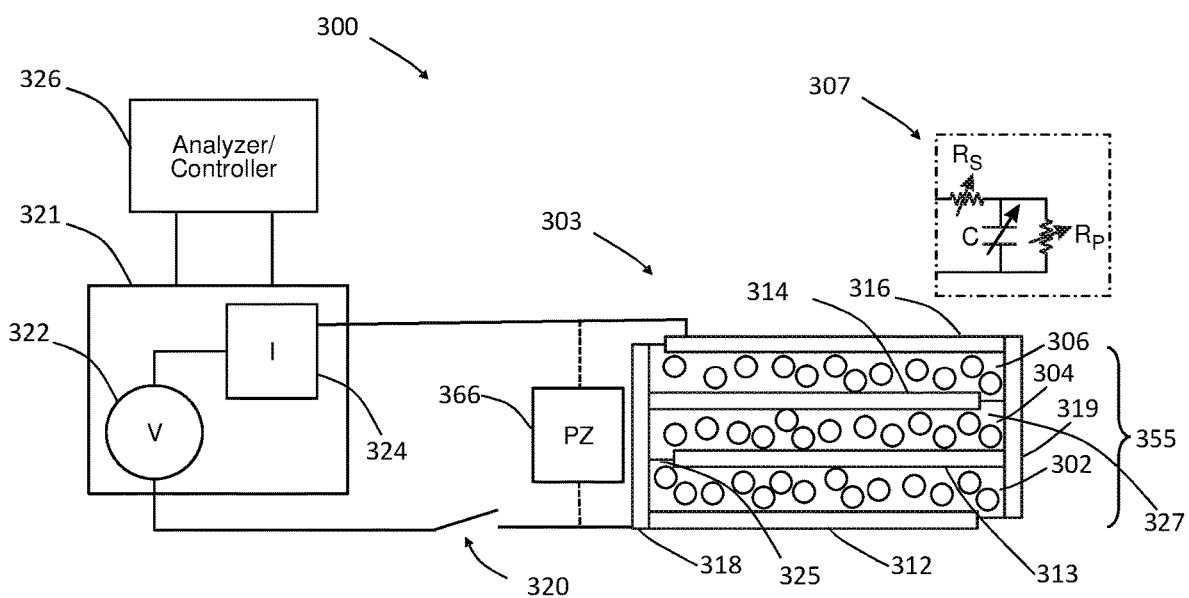
FIG. 3 shows an example diagram including a system for driving a multilayer electroactive device, in accordance with example embodiments of the disclosure.

FIG. 3 shows a diagram of an example in accordance with example embodiments of the disclosure. In particular, diagram 300 shows another electroactive device 303 that may be driven by an analyzer/controller 326 in combination with a power source 321. Further, electroactive device 303 may include a multilayer structure and may function as an actuator. In one embodiment, electroactive device 303 may be disposed on a substrate (not shown). Electroactive device 303 may include a first electroactive material 302, a second electroactive material 304, and a third electroactive material 306.

The electroactive device 303 may include a stack 355, the stack 355 including a first electrode layer 312 that may be composed of an electrically conductive material, a second electrode layer 313 that may be composed of an electrically conductive material, a third electrode layer 314 that may be composed of an electrically conductive material, and a fourth electrode layer 316 that may be composed of an electrically conductive material. As noted, the electrode layers may be composed of electrically conductive material and may variously serve as electrodes, as described in connection with first electrode 112 and second electrode 114 of FIG. 1, above.

Further, the electroactive device 303 may include a common bus 318 and/or a contact area 319, which may serve to electrically couple two or more of the various electrode layers (e.g., first electrode layer 312, second electrode layer 313, third electrode layer 314, and/or fourth electrode layer 316). Further, the common bus 318 and/or contact area 319 may also be composed of an electrically conductive material similar, but not necessarily identical to, to the electrically conductive material of the various electrode layers 312-316.

In certain embodiments, the electroactive device 303 may further include one or more additional electroactive material layers (e.g., similar, but not necessarily identical to, electroactive material layers 302, 304, and/or 306) and/or electrode material layers (e.g., similar, but not necessarily identical to, first electrode layer 312, second electrode layer 313, third electrode layer 314, and/or fourth electrode layer 316) overlapping in a stacked configuration from three electroactive material layers and corresponding electrodes as shown in FIG. 3 to thousands of electroactive material layers and corresponding electrodes (not shown).

In one embodiment, the electroactive device 303 may be represented as an equivalent circuit 307. The equivalent circuit 307 may include a series resistance component, a capacitance component, and/or a parallel resistance component, combinations thereof, and/or the like, as further shown and described in connection with equivalent circuit 107 of FIG. 1, above.

In another embodiment, diagram 300 shows a power source 321, which may include a voltage source 322. Further, the power source 321 may include a current source 324. Moreover, the power source 321 may be connected to an analyzer/controller 326. In another embodiment, diagram 301 shows a sensor 366. The sensor 366 may include a piezoelectric sensor. The various components described above may perform in a similar, but not necessarily identical manner, to similarly named components as shown and described in connection with FIG. 1, above (e.g., power source 121, voltage source 122, current source 124, analyzer/controller 126, and/or sensor 166 of FIG. 1).

In another embodiment, the electroactive device 303 may serve as an actuator. In an embodiment, the electroactive device 303 may include a substrate (e.g., a rigid substrate such as glass, sapphire and the like, or a flexible substrate such as paper, metal foil, plastic, and the like), not shown. As noted, in an embodiment, the electroactive device 303 may include a first electrode layer 312, which may be alternatively referred to as a first electrode herein. The first electrode material 312 may include an electrically conductive material and may serve as an electrode for the electroactive device 303. In an embodiment, the electroactive device 303 may optionally include a common bus 318. In an embodiment, the common bus 318 may include a portion of the first electrode material 312 (e.g., a portion of the electronic conducting material serving as an electrode).

In an embodiment, the electroactive device 303 may include a first electroactive material 302, such as a first nanovoided polymer material. In some embodiments, the first nanovoided polymer material may include a silicone resin, such as, for example, polydimethylsiloxane (PDMS). Additionally or alternatively, the first nanovoided polymer material may include, but not be limited to, acrylates, styrenes, polyesters, polycarbonates, and epoxies, and/or any other suitable polymer material.

In another embodiment, the electroactive device 303 may include a first insulating area 325, and in at least one embodiment, the first insulating area 325 may include a portion of the first electroactive material 302. In an embodiment, the electroactive device 303 may include a contact area 319. The contact area 319 may be similar to the common bus 318 and may be optional. The contact area 319 may allow for a connection (e.g., an electrical connection), to a second electrode material 313, which may be referred to as a second electrode herein. The second electrode material 313 may include an electrically conductive material that may serve as an electrode. In an embodiment, the electroactive device 303 may include a second insulating area 327. The second insulating area 327 may include a portion of a second electroactive material 304, which may include a second nanovoided polymer material.

In certain embodiments, the electroactive device 303 may further include one or more additional electroactive material layers and/or electrode material layers (e.g., third electroactive material layer 306, third electrode material layer 314, fourth electrode material layer 316, and/or the like) overlapping in a stacked configuration having from three electroactive material layers and corresponding electrodes, as shown, to thousands of electroactive material layers.

In an embodiment, the electroactive material layers and/or electrode material layers of the electroactive device 103 may be disposed on a substrate (not shown) that may include any suitable material. In particular, the substrate may include transparent materials such a sapphire or glass. In one embodiment, the substrate may include silicon, silicon oxide, silicon dioxide, aluminum oxide, sapphire, an alloy of silicon and germanium, and/or indium phosphide (InP), and the like. In some embodiments, the substrate may include a semiconductor material (e.g., monocrystalline silicon, germanium, silicon germanium, SiGe, and/or a group III-V based material, such as gallium arsenide, or any combination thereof). In various embodiments, the substrate may include a polymer-based substrate, glass, or any other bendable substrate including two-dimensional materials (e.g., graphene and molybdenum disulfide), organic materials (e.g., pentacene), transparent oxides (e.g., indium gallium zinc oxide (IGZO)), polycrystalline group III-V materials, polycrystalline germanium, polycrystalline silicon, amorphous group III-V materials, amorphous germanium, amorphous silicon, or any combination thereof.

In other embodiments, the substrate may include a flexible substrate and may be used in connection with printing or co-flowing fabrication process for the electroactive device. The flexible substrate may include, but not be limited to, paper, paperboard, plastic film (e.g., polyester film, polypropylene film, aluminum foil, woven fabric, etc.).

As noted, in some embodiments, the electrode materials (e.g., the first electrode material 312, the second electrode material 313, the third electrode material 314, the fourth electrode material 316, and/or other such materials) may include a conductive material. In additional embodiments, the conductive material may include metals such as aluminum, gold, silver, tin, copper, indium, gallium, zinc, and the like. Other conductive materials may be used, including carbon nanotubes, graphene, transparent conductive oxides (TCOs, such as indium tin oxide (ITO), zinc oxide (ZnO), etc.), and the like. In some configurations, it may be necessary for the electrode materials to stretch elastically. In such embodiments, the electrode materials may include TCOs, graphene, carbon nanotubes, and the like.

In some embodiments, the electrode materials may have a thickness of approximately 1 nm to approximately 100 nm, with an example thickness of approximately 10 nm to approximately 50 nm. Some of the electrode materials may be designed to allow healing of electrical breakdown (e.g., the electric breakdown of nanovoided polymer materials).

In some embodiments, the electrode materials may be fabricated using any suitable process. For example, the electrode materials may be fabricated using PVD, CVD, sputtering, spray-coating, spin-coating, atomic layer deposition (ALD), and the like. In another embodiment, the electrode materials may be manufactured using a thermal evaporator, a sputtering system, a spray coater, a spin-coater, an ALD unit, and the like.

In some embodiments, the electrode materials may be formed from a thin film of electrically conductive and semi-transparent material, such as indium tin oxide, ITO. In some implementations, alternatives to ITO may be used, including wider-spectrum transparent conductive oxides (TCOs), conductive polymers, metal grids, carbon nanotubes (CNT), graphene, nanowire meshes, and thin metal films. Additional TCOs may include doped binary compounds, such as aluminum-doped zinc-oxide (AZO) and indium-doped cadmium-oxide. Additional TCOs may include barium stannate and metal oxides, such as strontium vanadate and calcium vanadate. In some implementations, conductive polymers may be used as the electrode materials. For example, a poly(3,4-ethylenedioxythiophene) PEDOT: poly(styrene sulfonate) PSS layer may be used. In another example, a poly(4,4-dioctyl cyclopentadithiophene) material doped with iodine or 2,3-dichloro-5,6-dicyano-1,4-benzoquinone (DDQ) may be used. The example polymers and similar materials may be spin-coated in some embodiments.

As noted, in an embodiment, the electroactive materials (e.g., first electroactive material 302, second electroactive material 304, third electroactive material 306, and the like) may include nanovoided polymer materials. In another embodiment, the electroactive materials may include electroactive polymers and/or elastomer materials. In some examples, an "electroactive polymer" may refer to a deformable polymer that may be symmetric with regard to electrical charge (e.g., polydimethylsiloxane (PDMS) acrylates, and the like) or asymmetric (e.g., poled polyvinylidene fluoride (PVDF) or its copolymers such as poly[vinylidenefluoride-co-trifluoroethylene] (PVDF-TrFE)).

In some embodiments, the nanovoided polymer materials may include thermoplastic polymers. Suitable polymers may include, but are not limited to, polyolefins, for example, polyethylene homopolymers and copolymers, polypropylene, polypropylene homopolymers and copolymers, functionalized polyolefins, polyesters, poly(ester-ether), polyamides, including nylons, poly(ether-amide), polyether sulfones, fluoropolymers, polyurethanes, and mixtures thereof. Polyethylene homopolymers include those of low, medium or high density and/or those formed by high-pressure or low-pressure polymerization. Polyethylene and polypropylene copolymers include, but are not limited to, copolymers with C4-C8 alpha-olefin monomers, including 1-octene, 1-butene, 1-hexene, and 4-methyl pentene.

Other non-limiting examples of suitable olefinic polymeric compositions for use as the nanovoided polymer materials include olefinic block copolymers, olefinic random copolymers, polyurethanes, rubbers, vinyl arylenes and conjugated diener, polyesters, polyamides, polyethers, polyisoprenes, polyneoprenes, copolymers of any of the above, and mixtures thereof.

Examples of suitable copolymers for use as the nanovoided polymer materials include, but are not limited to, copolymers such as poly(ethylene-butene), poly(ethylene-hexene), poly(ethylene-octene), and poly(ethylene-propylene), poly(ethylene-vinylacetate), poly(ethylene-methylacrylate), poly(ethylene-acrylic acid), poly(ethylene-butylacrylate), poly(ethylene-propylenediene), poly(methyl methacrylate) and/or polyolefin terpolymers thereof.

In some aspects, the nanovoided polymer materials may include elastomeric polymers, including styrenic block copolymers, elastomeric olefinic block copolymers and combinations thereof. Non-limiting examples of suitable styrenic block copolymers (SBC's) include styrene-butadiene-styrene (SBS), styrene-isoprene-styrene (SIS), styrene-ethylene-butylene-styrene (SEBS), styrene-ethylene-propylene (SEP), styrene-ethylene-propylene-styrene (SEPS), or styrene-ethylene-ethylene-propylene-styrene (SEEPS) block copolymer elastomers, polystyrene, and mixtures thereof. In one embodiment, the film includes styrene-butadiene-styrene, polystyrene, and mixtures thereof.

The nanovoided polymer materials may further include optional components, such as fillers, plasticizers, compatibilizers, draw down polymers, processing aids, anti-blocking agents, viscosity-reducing polymers, and the like. Other additives may include pigments, dyes, antioxidants, antistatic agents, slip agents, foaming agents, heat or light stabilizers, UV stabilizers, and the like.

As noted, in various embodiments, the electroactive materials (e.g., first electroactive material 302, second electroactive material 304, third electroactive material 306, and the like) may include elastomer materials. In some embodiments, an "elastomer material" may refer to a polymer with viscoelasticity (i.e., both viscosity and elasticity) and relatively weak intermolecular forces, and generally low elastic modulus (a measure of the stiffness of a solid material) and high failure strain compared with other materials.

In some embodiments, the electroactive materials (e.g., first electroactive material 302, second electroactive material 304, third electroactive material 306, and the like) may include nanovoided polymer materials; further, the nanovoided polymer materials may include an elastomer material that has an effective Poisson's ratio of less than a predetermined value (e.g., less than approximately 0.35, less than approximately 0.3, less than approximately 0.25, less than approximately 0.2, less than approximately 0.15, less than approximately 0.1, less than approximately 0.5). In at least one example, the elastomer material may have an effective density that is less than a predetermined value (e.g., less than approximately 90%, less than approximately 80%, less than approximately 70%, less than approximately 60%, less than approximately 50%, less than approximately 40%) of the elastomer when densified (e.g., when the elastomer is compressed, for example, by electrode materials to make the elastomer denser).

In some examples, the electroactive materials (e.g., first electroactive material 302, second electroactive material 304, third electroactive material 306, and the like) may include nanovoided polymer materials that may include a plurality of voids, including nano-sized voids. In some embodiments, the nanovoids may occupy at least approximately 10% (e.g., approximately 10% by volume, approximately 20% by volume, approximately 30% by volume, approximately 40% by volume, approximately 50% by volume, approximately 60% by volume, approximately 70% by volume, approximately 80% by volume, approximately 90% by volume) of the volume of the nanovoided polymer materials. The voids and/or nanovoids may be either closed- or open-celled, or a mixture thereof. If they are open-celled, the void size may be the minimum average diameter of the cell. In some embodiments, the polymer layer may have an elastic modulus of less than approximately 10 GPa (e.g., approximately 0.5 GPa, approximately 1 GPa, approximately 2 GPa, approximately 3 GPa, approximately 4 GPa, approximately 5 GPa, approximately 6 GPa, approximately 7 GPa, approximately 8 GPa, approximately 9 GPa).

The voids and/or nanovoids may be any suitable size and, in some embodiments, the voids may approach the scale of the thickness of the polymer layer in the undeformed state. For example, the voids may be between approximately 10 nm to about equal to the gap between the paired two electrodes. In some embodiments, the voids may be between approximately 10 nm and approximately 1000 nm, such as between approximately 10 and approximately 200 nm (e.g., approximately 10 nm, approximately 20 nm, approximately 30 nm, approximately 40 nm, approximately 50 nm, approximately 60 nm, approximately 70 nm, approximately 80 nm, approximately 90 nm, approximately 100 nm, approximately 110 nm, approximately 120 nm, approximately 130 nm, approximately 140 nm, approximately 150 nm, approximately 160 nm, approximately 170 nm, approximately 180 nm, approximately 190 nm, approximately 200 nm, approximately 250 nm, approximately 300 nm, approximately 400 nm, approximately 500 nm, approximately 600 nm, approximately 700 nm, approximately 800 nm, approximately 900 nm, approximately 1000 nm).

In some examples, the term "effective density," as used herein, may refer to a parameter that may be obtained using a test method where a uniformly thick layer of a given electroactive material including a nanovoided polymer material (e.g., elastomer) may be placed between two flat and rigid circular plates. In some embodiments, the diameter of the nanovoided polymer material being compressed may be at least 100 times the thickness the nanovoided polymer material. The diameter of the nanovoided polymer material may be measured, then the plates may be pressed together to exert a pressure of at least approximately $1 \times 10^6$ Pa on the nanovoided polymer material, and the diameter of the nanovoided polymer material may be remeasured. The effective density may be determined from the following expression: $D_{ratio} = D_{uncompressed}/D_{compressed}$, where $D_{ratio}$ may represent the effective density ratio, $D_{uncompressed}$ may represent the density of the uncompressed nanovoided polymer material, and $D_{compressed}$ may represent the density of the uncompressed nanovoided polymer material.

In some embodiments, the electroactive materials (e.g., first electroactive material 302, second electroactive material 304, third electroactive material 306, and the like) may include particles of a material having a high dielectric constant, the particles having an average diameter between approximately 10 nm and approximately 1000 nm. In some embodiments, the material having the high dielectric constant may include barium titanate $BaTiO_3$), which is a member of the perovskite family and which may also include other titanates. Additionally or alternatively, any other suitable component may be added to the electroactive polymer material. In particular, $BaTiO_3$ is a ferroelectric material with a relatively high dielectric constant (e.g., a value of between approximately 500 and approximately 7000) and polarization and may be used in various electroactive devices described herein. Besides large polarizability and permittivity, large strains may also be achievable with $BaTiO_3$. Pure $BaTiO_3$ is an insulator whereas upon doping it may transform into a semiconductor in conjunction with the polymer material. In some embodiments, the particles of the materials having high dielectric constant may be included in the polymer to modify a mechanical (e.g., a Poisson's ratio) or electrical property (resistance, capacitance, etc.) of the electroactive polymer materials, including nanovoided polymer materials.

In some embodiments, the electroactive materials (e.g., first electroactive material 302, second electroactive material 304, third electroactive material 306, and the like) may include nanovoided polymer materials that may have a thickness of approximately 10 nm to approximately 10 μm (e.g., approximately 10 nm, approximately 20 nm, approximately 30 nm, approximately 40 nm, approximately 50 nm, approximately 60 nm, approximately 70 nm, approximately 80 nm, approximately 90 nm, approximately 100 nm, approximately 200 nm, approximately 300 nm, approximately 400 nm, approximately 500 nm, approximately 600 nm, approximately 700 nm, approximately 800 nm, approximately 900 nm, approximately 1 μm, approximately 2 μm, approximately 3 μm, approximately 4 μm, approximately 5 μm, approximately 6 μm, approximately 7 μm, approximately 8 μm, approximately 9 μm, approximately 10 μm), with an example thickness of approximately 200 nm to approximately 500 nm.

In some embodiments, the electroactive materials (e.g., first electroactive material 302, second electroactive material 304, third electroactive material 306, and the like) may include a first elastomer material and a second elastomer material, respectively, each having a Poisson's ratio of approximately 0.35 or less. In some embodiments, the electroactive materials may include particles of a material to assist the formation or to support the voided regions, or both. Suitable particles include a silicate, such as silica, including structures resulting from silica gels, fumed silica, a titanate, such as barium titanate, a metal oxide, such as titanium dioxide, composites thereof, and the like. The particles may have an average diameter between approximately 10 nm and approximately 1000 nm, and the particles may form branched or networked particles with average dimensions of between approximately 100 and approximately 10,000 nm.

FIGS. 4A and 4B show diagrams of example electroactive devices, in accordance with one or more embodiments of the disclosure. According to some embodiments, as shown in FIGS. 4A and 4B, an electroactive device 450 (similar, but not necessarily identical to, electroactive device 103 of FIG. 1, above) may include a pair of electrodes including a primary electrode 452 and a secondary electrode 454. These paired electrodes may be spaced with an electroactive polymer element 456 formed of, for example, an electroactive nanovoided polymer material positioned therebetween such that primary electrode 452 abuts a first surface 458 of electroactive polymer element 456 and secondary electrode 454 abuts a second surface 460 of electroactive polymer element 456 opposite the first surface. Electroactive polymer element 456 may additionally or alternatively have any suitable dimensions, including any suitable thickness and/or width, without limitation.

In some embodiments, electroactive polymer element 456 may be deformable from an undeformed state, as illustrated in FIG. 4A, or a partially deformed state to a more fully deformed state, as illustrated in FIG. 4B, when a voltage difference is applied between primary electrode 452 and secondary electrode 454. In some embodiments, the deformed state of electroactive polymer element 456 may be a compressed state in which electroactive polymer element 456 has a decreased thickness $T_2$ in the Y-direction, as shown in FIG. 4B. Thickness, as used herein, may refer to the extent of at least a portion of an electroactive polymer element parallel to an E-field generated between paired electrodes abutting the electroactive polymer element. In some embodiments, the initial state of electroactive polymer element 456 may be a state that is not influenced by an E-field or one already influenced by an E-field generated between primary electrode 452 and secondary electrode 454, and the E-field may be increased to amplify the E-field-induced deformations.

An exemplary direction $E_1$ of the lines of the electrostatic field between primary electrode 452 and secondary electrode 454 is represented in FIGS. 4A and 4B. According to some embodiments, an amount of deformation of electroactive polymer element 456 in the deformed state, as shown in FIGS. 4A and 4B, may correspond to the strength of the E-field or, equivalently, an amount of voltage applied between primary electrode 452 and secondary electrode 454. In at least one example, when electroactive polymer element 456 is in a compressed state, electroactive polymer element 456 may expand laterally (i.e., in the X-direction shown in FIG. 4B) such that electroactive polymer element 456 has an increased width in the X-direction. In some embodiments, electroactive polymer element 456 may be initially stretched in the X-direction.

In some embodiments, the application of a voltage to the electroactive polymer element (e.g., electroactive polymer element 456) may change the internal pressure of gases in the nanovoided regions of the electroactive polymer element. For example, gases or liquids may diffuse either into or out of the electroactive polymer element during dimensional changes associated with its deformation. Such changes in the electroactive polymer elements can affect, for example, the hysteresis of an electroactive device (e.g., device 450) incorporating the electroactive polymer during dimensional changes, and also may result in drift when the electroactive polymer element's dimensions are rapidly changed. Accordingly, in an embodiment, the nanovoids may be filled with a gas to suppress electrical breakdown of the electroactive polymer element (for example, during deformation). In another embodiment, the gas may include sulfur hexafluoride, fluorocarbon gases (e.g., 3M NOVEC 4710 insulating gas, available from 3M Company, Maplewood, Minn., USA), or any suitable gas.

In another embodiment, the electroactive device (e.g., an actuator) 450 may have a sealing layer (not shown) applied to the edges of the electroactive device 450, and/or to one or more of the electrodes (e.g., the primary electrode 452 and/or the secondary electrode 454), or a combination thereof. Suitable sealing layers may include thin film layers of an inorganic material, such as silica, applied with any suitable method, including, for example, atomic layer deposition (ALD), physical vapor deposition (PVD), chemical vapor deposition (CVD), or the like. The thin film layers may also be made from one or more dyads of a polymer layer and an inorganic layer. In an embodiment, the sealing layer may also include a barrier material, such as polychlorotrifluoroethylene (PCTFE) or other polymer applied by solvent and/or with initiated-CVD.

In one embodiment, the electroactive polymer element 456 may have a maximum thickness (e.g., thickness $T_1$ shown in FIG. 4A) in an undeformed or relaxed state and a minimum thickness (e.g., thickness $T_2$ shown in FIG. 4B) in a deformed state (e.g., a maximally deformed state) when a voltage difference of at least a certain value is applied between primary electrode 452 and secondary electrode 454. In some embodiments the maximum thickness of electroactive polymer element 456 may be from approximately 10 nm to approximately 10 µm. Additionally, or alternatively, a width of electroactive polymer element 456 in the undeformed state may be from approximately 100 nm to approximately 100 µm (e.g., approximately 100 nm, approximately 500 nm, approximately 1 µm, approximately 10 µm, approximately 20 µm, approximately 30 µm, approximately 40 µm, approximately 50 µm, approximately 60 µm, approximately 70 µm, approximately 80 µm, approximately 90 µm, approximately 100 µm). Width, as used herein, may refer to the extent of at least a portion of an electroactive polymer element in a dimension transverse to that of the expected electrostatic field.

Figure 5:
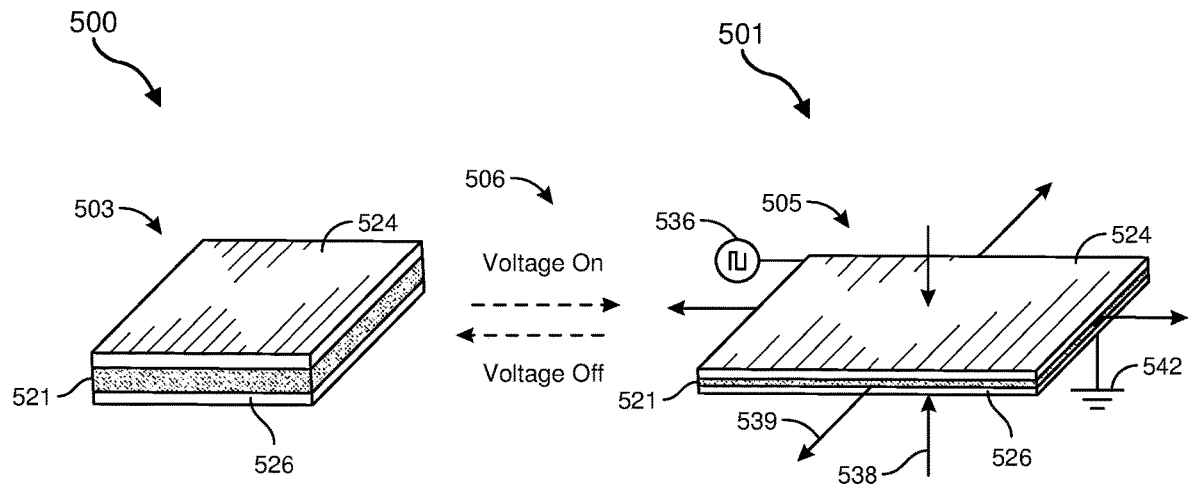
FIG. 5 shows a diagram of an example planar electroactive device with and without the application of a voltage, in accordance with example embodiments of the disclosure.

FIG. 5 shows diagrams of an example planar electroactive device with and without the application of a voltage, in accordance with example embodiments of the disclosure. In particular, FIG. 5 shows a diagram 500 of an electroactive device 503 that may be similar to the electroactive devices 103, 303, and/or 450 described above in connection with FIGS. 1, 3, and 4, respectively. In one embodiment, the electroactive device 503 may include an electroactive material 521 including an electroactive polymer (EAP), which may be sandwiched by a first electrode 524 and a second electrode 526. In various embodiments, the electroactive material 521 may have nanovoids, which may increase the efficiency and performance characteristics of the electroactive material 521, may tailor the response of the electroactive material 521 to applied forces, and the like, as described above.

FIG. 5 further illustrates the transition 506 between the electroactive device 503 in diagram 500 going from a first state with no voltage application to an electroactive device 505 in diagram 501 in a second state with voltage applied to an electrode (e.g., the first electrode 524) of the electroactive device 505, and another electrode (e.g., second electrode 526) of the electroactive device 505 connected to ground 542. In particular, the first electrode 524 may be connected to an analyzer/controller 536 (e.g., similar to the analyzer/controller 126 of FIG. 1, above) and a power source (not shown). Further, the analyzer/controller 536 may be used to monitor and control the electroactive device 505. In particular, the electroactive material 521 may be controlled by the analyzer/controller 536 using feedback control as described herein (for example, in connection with FIG. 1, above). Accordingly, embodiments of the disclosure described tracking the state (e.g., the shape and/or position or the force output of an electroactive material 521) by monitoring one or more parameters associated with the electroactive material 521 and electroactive device 505 (such as capacitance, resistance, combinations thereof, and/or the like), and by using this tracking to adjust the control of the electroactive device 505. As noted, the tracking can be performed based at least in part on by an external sensor (not shown), similar to sensor 166 of FIG. 1, above.

Further, in another embodiment, changes in various parameters of the electroactive device 505 (such as the electroactive device's 505 resistance and/or capacitance) may occur when the electroactive material 521 is stretched 539 and/or compressed 538 and can be used to measure electroactive material's 521 shape. Moreover, changes in various parameters of the electroactive device 505 may be determined even when the stretching of the electroactive material 521 results from applying a voltage by the analyzer/controller 536 to electrodes 524 and 526 and thereby, to the electroactive material 521. In another embodiment, electroactive materials including nanovoids may have substantially the same or similar behavior as electroactive material not having nanovoids, at least because the nanovoids may not substantially change the underlying physics governing the measurement of various parameters (e.g., a capacitance, resistance, and the like) and the changes in the shape of the electroactive device 505.

In at least one embodiment, electroactive materials including nanovoids may have improved performance and/or characteristics in comparison with electroactive materials that are not nanovoided. For example, nanovoided electroactive material 521 may experience a greater degree of deformation (e.g., compression) in the presence of an electric field in comparison to an electroactive material that is not nanovoided. Additionally or alternatively, nanovoided electroactive material 521 may experience more uniform and/or consistent deformation (e.g., compression) throughout in the presence of an electric field in comparison to an electroactive material that is not nanovoided. In some embodiments, the greater amount of deformation by nanovoided electroactive material 521 and/or the increased uniformity in deformation may facilitate more accurate tracking and/or control of electroactive device 505.

Figure 6:
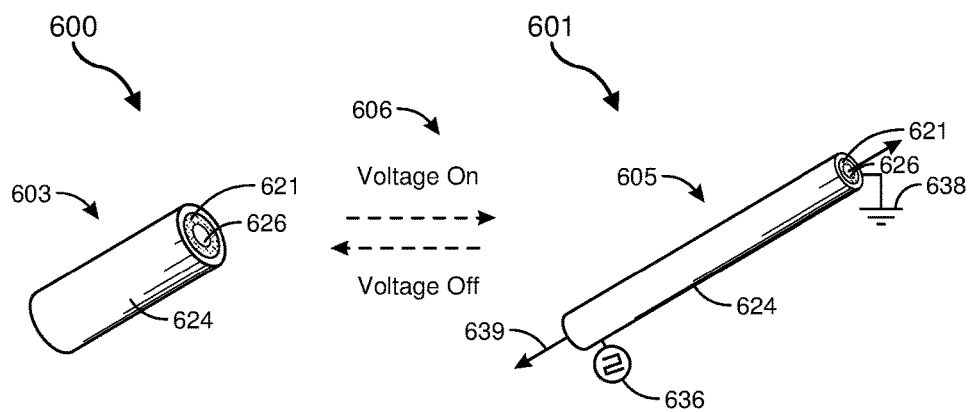
FIG. 6 shows a diagram of an example radial electroactive device with and without the application of a voltage, in accordance with example embodiments of the disclosure.

FIG. 6 shows a diagram of an example radial electroactive device with and without the application of a voltage, in accordance with example embodiments of the disclosure. As described further below, the radial electroactive device 603 (which may also be referred to as a cylindrical electroactive device and/or a roll electroactive device) may include an actuator that may be coated with an electroactive material that is rolled around an axis. Further, when a voltage is applied to the radial electroactive device 603, the electronic device 603 may transition 606 to a different state where a force and an elongation 639 may be generated in an axial direction. In another embodiment, the radial electroactive device 603 can be rolled around any suitable material, for example, a compression spring, with or without a core. In some embodiments, the radial electroactive device 603 may find application in many fields including, but not limited to, artificial muscles (prosthetics), mini- and microrobots, and/or valves, in addition to applications in artificial reality.

In particular, FIG. 6 shows a diagram 600 of a radial electroactive device 603, that may be similar to the electroactive devices 103, 303, and/or 450 described above in connection with FIGS. 1, 3, and 4, respectively; however, the electroactive material 621 the first electrode 624, and the second electrode 626 of the radial electroactive device 603 may have a radial configuration rather than a planar configuration. In one embodiment, the radial electroactive device 603 may include an electroactive material 621 including an electroactive polymer (EAP), which may be electronically coupled to a first electrode 624 and a second electrode 626. In various embodiments, the electroactive material 621 may have nanovoids, which may increase the efficiency and performance characteristics of the electroactive material 621, may tailor the response of the electroactive material 621 to applied voltages, as described above.

FIG. 6 further illustrates the transition 606 between the radial electroactive device 603 in diagram 600 going from a first state with no voltage application to an radial electroactive device 605 in diagram 601 in a second state with voltage applied to an electrode (e.g., the first electrode 624) of the radial electroactive device 605, and another electrode (e.g., second electrode 626) of the radial electroactive device 605 connected to ground 638. In particular, the first electrode 624 may be connected to an analyzer/controller 636 (e.g., similar to the analyzer/controller 126 of FIG. 1, above) and a power source (not shown). Further, the analyzer/controller 636 may be used to monitor and control the electroactive device 605. In particular, the electroactive material 621 may be controlled by the analyzer/controller 636 using feedback control as described herein (for example, in connection with FIG. 1, above). Accordingly, analyzer/controller 636 and the power source may be used to track and control the state (e.g., the shape and/or position or the force output of an electroactive material 621 by monitoring one or more parameters associated with the electroactive material 621 and radial electroactive device 605, such as capacitance, resistance, and the like), and by using this tracking to adjust the control of the radial electroactive device 605. As noted, the tracking can be performed based at least in part on by an external sensor (not shown but similar to sensor 166 of FIG. 1, described above).

Further, in another embodiment, changes in various parameters of the radial electroactive device 605 (such as the radial electroactive device's 605 resistance and/or capacitance and/or the like) may occur when the electroactive material 621 is elongated 639, which may be used to determine the state of the radial electroactive device 605. In one embodiment, the electroactive material 621 may include nanovoided EAPs that may have substantially similar behavior as those electroactive materials not including nanovoids, as the presence of nanovoids may not substantially change the underlying physics used to map a capacitance measurement to the state of the radial electroactive device 605 (e.g., the shape and/or force output of the radial electroactive device 605).

In various embodiments, additional geometrical configurations for an electroactive device (e.g., actuator) in addition to or alternative to the configurations shown in connection with FIGS. 5 and 6 may include, but not be limited to, any of the following configurations and/or device types. In particular, the electroactive device may include a diaphragm actuator, where an electroactive device is fabricated with a planar construction similar to FIG. 5, above, and the electroactive device is biased in an axis orthogonal to the plane of the electroactive material (e.g., the z-axis) in order to produce out of plane motion. In another embodiment, the electroactive device may include a shell-like actuator, where a planar electroactive material (e.g., an elastomer) electrically coupled (e.g., coating) at specific locations with electrode segments; further, upon the application of voltage(s) to the electrode segments, the shell-like actuator may assume complex three-dimensional shapes. In yet another embodiment, the electroactive device may include a bending actuator, where the in-plane (e.g., x-y axis based actuation, where the x and y axes are in the plane of the electroactive material of the actuator) actuation is converted into out-of-plane (e.g., an axis orthogonal (i.e., the z-axis) to the plane of the electroactive material) actuation such as bending or folding using unimorph configuration where one or multiple layers of electroactive materials are stacked on top of one another.

Figure 7:
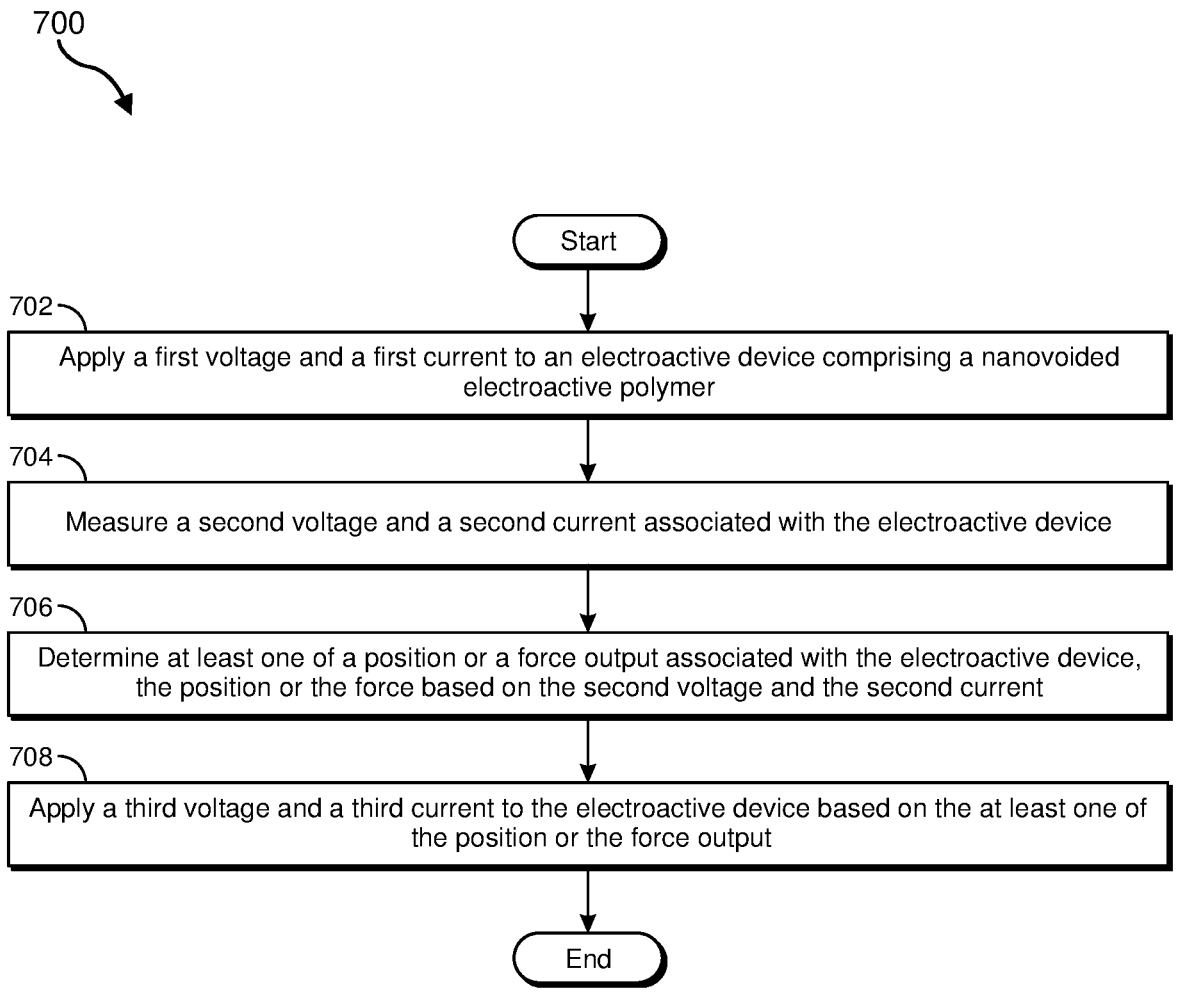
FIG. 7 shows a diagram of an example flow chart illustrating aspects of driving electroactive devices, in accordance with example embodiments of the disclosure.

FIG. 7 shows an example flow diagram illustrating aspects of driving an electroactive device, in accordance with example embodiments of the disclosure. At step 702 in FIG. 7, a first voltage and a first current may be applied to an electroactive device including a nanovoided electroactive polymer (see, e.g., voltage source 122 and current source 124 in FIG. 1). In one embodiment, the electroactive device may include a dielectric elastomer actuator. Further, the electroactive device may include a first electrode adjacent to a first surface of the nanovoided electroactive polymer and a second electrode adjacent to a second surface of the nanovoided electroactive polymer. In another embodiment, the nanovoided electroactive polymer may include a concentration of the nanovoids per unit volume that is approximately 10% to approximately 90%. In another embodiment, the nanovoided electroactive polymer may include any suitable material such as of a polymer or an oxide, combinations thereof, and/or the like.

At step 704 in FIG. 7, a second voltage and a second current associated with the electroactive device may be measured. In one embodiment, the second voltage and the second current may be measured using an analyzer/controller (e.g., an analyzer/controller similar to the analyzer/controller 126 of FIG. 1, above).

At step 706 in FIG. 7, at least one of a position or a force output associated with the electroactive device may be determined, the position or the force based on the second voltage and the second current. In particular, the determination of the position and/or force output associated with the electroactive device may include a determination of a capacitance associated with the electroactive device based on the second voltage and the second current. Further, the determination of the position and/or force output associated with the electroactive device may include determining a parallel resistance or a series resistance (or both) associated with the electroactive device based on the second voltage and the second current. In various embodiments, such determinations may be performed using any suitable electronic circuitry and/or processor(s) along with suitable computer-executable instructions.

At step 710 in FIG. 7, a third voltage and a third current may be applied to the electroactive device based on the at least one of the position or the force output. In another embodiment, applying the third voltage and the third current to the electroactive device may include determining an error value associated with the position or a force output. Moreover, a first signal proportional to the error value, a second signal based on an integral of the error value, and/or a third signal based on a derivative of the error value may be determined (e.g., a form of PID control as discussed in connection with FIG. 1, above). Further, the third voltage and the third current may be applied based on at least one of the first signal, the second signal, or the third signal.

Figure 8:
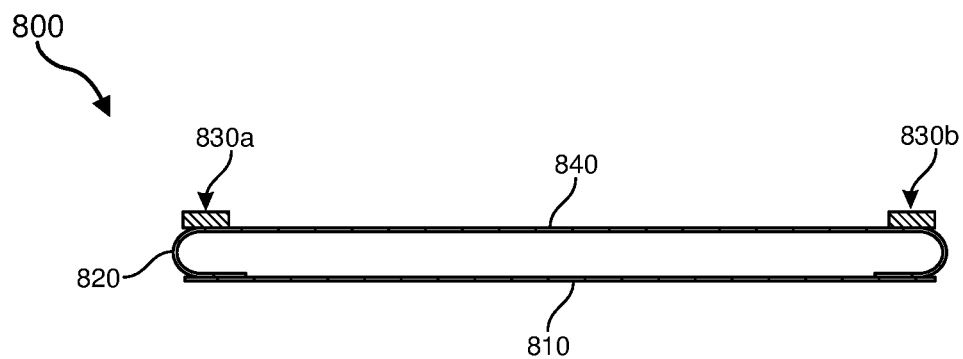
FIG. 8 shows a cross-sectional view of an example deformable element and a lens assembly which may include one or more electroactive devices described herein, in accordance with example embodiments of the disclosure.

FIG. 8 shows a diagram of a cross-sectional view of an example deformable element and a lens assembly which may include one or more electroactive devices described herein, in accordance with embodiments of the disclosure. As shown in FIG. 8, adjustable lens 800 may be an adjustable lens with a structural support element 810 (e.g., a rigid backplane) and a deformable optical element 840, with a seal 820 formed between the structural support element 810 and the deformable optical element 840. In various embodiments, the adjustable lens may include any suitable type of lens with adjustable optical properties (e.g., adjustable optical power/focal length, correcting for wavefront distortion and/or aberrations, etc.). In some examples, as will be explained in greater detail below, an adjustable lens may include a liquid lens. For example, adjustable lens 800 may be filled with an optical medium that is at least partially encapsulated by a deformable optical element (i.e., between structural support element 810 and deformable optical element 840). For example, lens 800 may be filled with a liquid or a semi-solid material (e.g., a gel, a semi-solid polymer, etc.). In general, lens 800 may contain a substantially transparent material that deforms and/or flows under pressure.

Structural support element 810 and deformable optical element 840 may be composed of any suitable materials. In some examples, structural support element 810 may include a rigid material. For example, structural support element 810 may be composed of a rigid, substantially transparent polymer. Deformable optical element 840 may include a substantially transparent and elastic material. For example, deformable optical element 840 may be composed of a natural or synthetic elastomer that returns to a resting state when a deforming force is removed. As will be explained in greater detail below, in some examples deformable optical element 840 may be deformed using an electroactive device (e.g., actuator) generating a directly-driven force to produce a desired optical power or other optical property for lens 800.

Although the lens 800 is unactuated in FIG. 8, forces may be applied by electroactive device(s) to lens 800 to actuate the lens 800 (as will be described in connection with FIG. 9). Such electroactive device(s) may be similar to the electroactive devices shown and described in the disclosure, for example, in connection with FIGS. 1, 2, and/or 4, above. Further, the forces may be uniform around a perimeter of lens 800 or may be variable around the perimeter of lens 800. For example, a vector (not shown) corresponding to a force applied by mechanical action of a first electroactive device (e.g., a first actuator) 830*a* may be the same as a vector corresponding to a force applied by mechanical action of a second electroactive device (e.g., a second actuator) 830*b*. Alternatively, a vector corresponding to a force applied by mechanical action of a first electroactive device 830*a* may be different from a vector corresponding to a force applied by mechanical action of a second electroactive device 830*b*.

Figure 9:
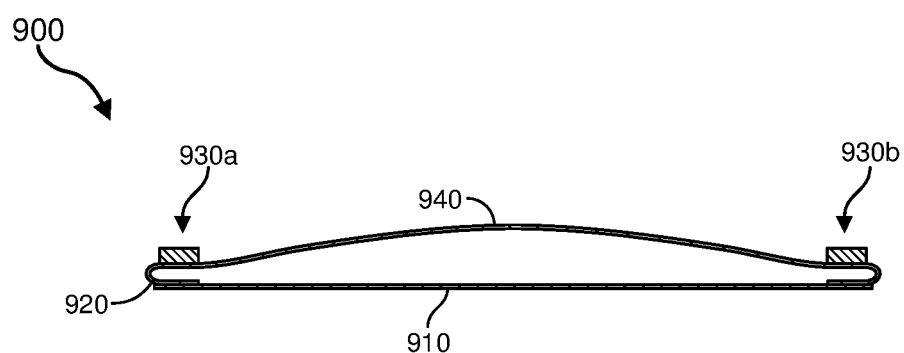
FIG. 9 shows a cross-sectional view of the example deformable element and a lens assembly of FIG. 8 in an actuated state, in accordance with example embodiments of the disclosure.

FIG. 9 shows a diagram of a cross-sectional view of the example deformable element and a lens assembly of FIG. 8 in an actuated state, in accordance with embodiments of the disclosure. In particular, FIG. 9 depicts adjustable lens 800 being actuated by receiving force applied by mechanical action of two different electroactive devices, which may also be similar to the electroactive devices shown and described in the disclosure, for example, in connection with FIGS. 1, 2, and/or 4, above. In this example, first electroactive device 830*a* may apply a pushing force (not shown) having a vector of a first magnitude and first direction to a first area on the perimeter of lens 800. Second electroactive device 830*b* may apply a pushing force (not shown) having vector of a second magnitude and second direction to a second area on the perimeter of lens 800 to achieve a desired optical power or other optical property for the lens 800. Those skilled in the art will understand that other embodiments may use various combinations of compression and distension, with various numbers of actuators applying varying forces to various locations on a deformable optical element to achieve desired optical properties for the lens.

The forces applied by the electroactive device in FIG. 9 to actuate the lens 800, as well as any other suitable forces, may be applied by any suitable type electroactive device, such as that shown and described in connection with FIGS. 1, 2, and/or 4 of the disclosure. In another embodiment, at least one of the electroactive devices (e.g., one of the electroactive devices 830*a* and 830*b*) may include a direct-drive actuator. As used in some embodiments, the term "direct-drive actuator" may refer to an actuator used in a direct-drive system or configuration (e.g., any configuration that does not involve an intermediate, off-axis device to transmit power). In contrast, indirect-drive systems may have at least one drive-train component (e.g., a belt, a chain, a ball-screw mechanism, a gear, etc.) that is not connected along the same axis of movement as the actuator. Examples of direct-drive actuators may include, without limitation, electrically driven actuators, electroactive benders, voice coil actuators, shape memory alloys, hydraulic pumps, etc.

As noted, in various embodiments, a direct-drive actuator may include a bender. In some examples, the term "bender," as used herein, may refer, without limitation, to an electrically-driven actuator based on a plate or beam design that converts in-plane contraction, via an applied electric field, into out-of-plane displacement. A bender or bending actuator may include an all-electroactive or composite material stack operated in a bimorph, unimorph, or multilayered monolith configuration. In some embodiments, the term "unimorph bender," as used herein, may refer, without limitation, to a beam or plate having an electroactive layer and an inactive layer, in which displacement results from contraction or expansion of the electroactive layer. In some embodiments, the term "bimorph bender," as used herein, may refer, without limitation, to a beam or plate having two electroactive layers, in which displacement results from expansion or contraction of one layer with alternate contraction or expansion of the second layer.

In some embodiments, the term "multilayer bender," as used herein, may refer, without limitation, to a multilayer stack of electroactive, electrode, and/or insulation layers (e.g., layers including an insulating material) integrated with alternating contracting and expanding electroactive layers into a monolithic bender. The piezoelectric layers in multilayer piezoelectric benders may enable high electric fields (and therefore high force and displacement) to occur at low voltages. Multilayer benders may include multiple thin piezoceramic layers, which may require lower voltages to achieve similar internal stress to bimorph and unimorph designs. Charge and voltage control in open or closed loops may also be implemented in multilayer benders, with some adjustment. In some examples, a control system for a multilayer bender may not require a high voltage power supply.

According to some embodiments, an electroactive device including an actuator may be a frame-contoured ring bender and/or may include stacked or overlapping benders. Furthermore, actuator volume may be constrained to an edge region outside an optical aperture, which may include a perimeter volume of a lens, an optical element, an optical sub-assembly, etc. As noted, electroactive device(s) such as an actuator (or a set of actuators) may provide equal or varied force and displacement at discrete points or along a spatially-defined distribution at the perimeter of a lens.

In one embodiment, the electroactive device including direct-drive benders disclosed herein may include a polymer material that is disposed between two abutting materials (e.g., electrodes). In such examples, methods of forming an electroactive device may involve forming electrodes and a nanovoided polymer material simultaneously (e.g., via coflowing, slot die coating, curtain coating, etc.).

Figure 10:
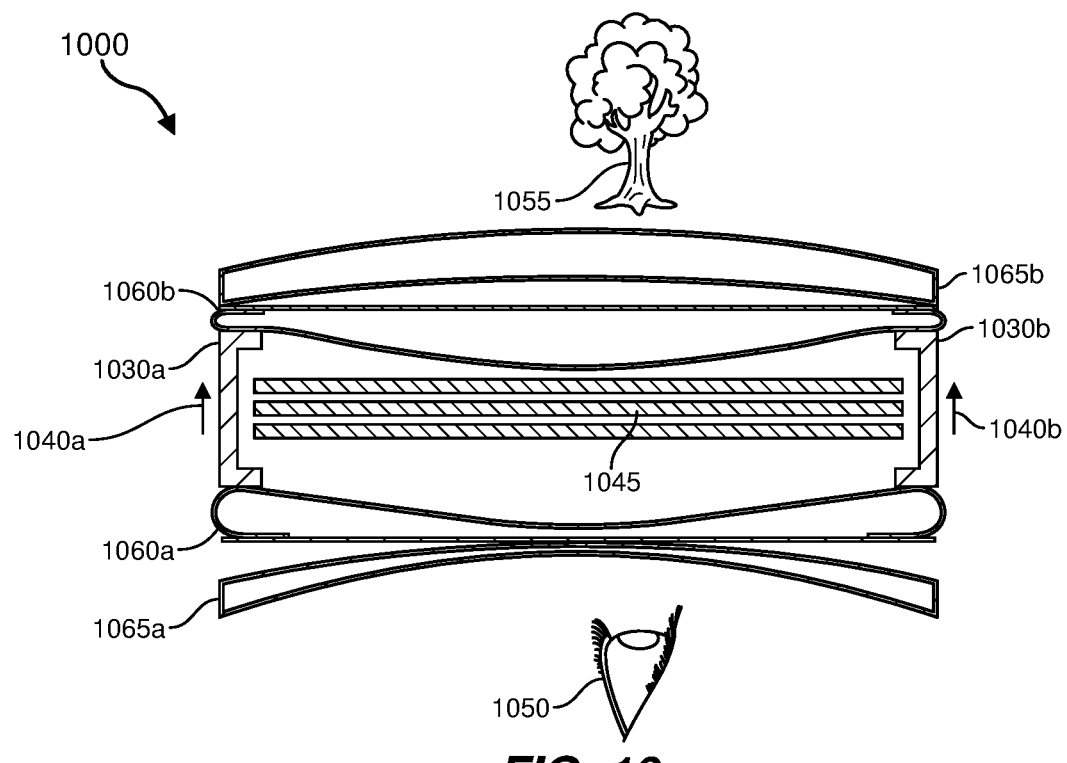
FIG. 10 shows a cross-sectional view of an example lens assembly device with multiple deformable elements (e.g., multiple liquid lenses) including electroactive devices, in accordance with example embodiments of the disclosure.

FIG. 10 shows a diagram of an example cross-sectional view of a lens assembly device with multiple deformable elements (e.g., multiple liquid lenses) including electroactive devices, in accordance with some embodiments of the disclosure. In particular, FIG. 10 shows a side view of a lens-display assembly 1000. As shown in FIG. 10, lens-display assembly 1000 may include an adjustable-focus lens 1060*a* and an adjustable-focus lens 1060*b*. In addition, lens-display assembly 1000 may include a carriage 1030*a* and a carriage 1030*b*, each of which connect adjustable-focus lens 1060*a* to adjustable-focus lens 1060*b* (e.g., via respective electroactive devices).

Because carriages 1030*a* and 1030*b* are connected to electroactive devices (e.g., direct-drive actuators) coupled to both adjustable-focus lens 1060*a* and adjustable-focus lens 1060*b*, when carriage 1030*a* and/or 1030*b* moves, carriage 1030*a* and/or 1030*b* may apply forces to adjustable-focus lens 1060*a* and adjustable-focus lens 1060*b* simultaneously, thereby deforming and modifying the optical power of adjustable-focus lenses 1060*a* and 1060*b*.

In addition, in some examples, lens-display assembly 1000 may include a display 1045 situated between adjustable-focus lenses 1060*a* and 1060*b*. For example, display 1045 may include an augmented-reality display that is substantially translucent (except for, e.g., virtual objects displayed by display 1045), allowing a user's eye 1050 to see beyond display 1045 to real-world objects such as a tree 1055 illustrated in FIG. 10.

In some embodiments, carriages 1030*a* and 1030*b* may each apply equal pressure to adjustable-focus lens 1060*a* and adjustable-focus lens 1060*b* (e.g., pressure sufficient to maintain tension within the respective membranes of adjustable-focus lenses 1060*a* and 1060*b* but not to deform adjustable-focus lenses 1060*a* and 1060*b*). Accordingly, adjustable-focus lenses 1060*a* and 1060*b* may be flat and exhibit no substantial optical power. Thus, the apparent accommodation distance of a virtual object displayed by display 1045 may be the actual distance of display 1045 from the user's eye 1050. Likewise, lens-display assembly 1000 may not significantly change the appearance of tree 1055 to the user's eye 1050.

In some examples, one or more of the carriages described herein may be rigid. Additionally or alternatively, one or more of the carriages described herein may have a degree of elasticity in one or more directions. In some examples, the length of the carriages may be fixed. In some examples, the length of the carriages may be adjustable. For example, the length of a carriage may be manually adjustable by using, e.g., a set screw or an adjustable threaded shaft. Additionally or alternatively, the length of the carriage may be dynamically adjustable through the use of, for example, a piezoelectric stack.

In one embodiment, FIG. 10 depicts lens-display assembly 1000 in an adjusted state. As shown in FIG. 10, carriages 1030*a* and 1030*b* may be actuated by one or more actuators (e.g., electroactive devices as described herein) to move away from the user's eye 1050 and adjustable-focus lens 1060*a*, and toward adjustable-focus lens 1060*b*. In the process, forces 1040*a* and 1040*b* applied by carriages 1030*a* and 1030*b*, respectively, may shape adjustable-focus lens 1060*a* into a plano-concave lens, and shape adjustable-focus lens 1060*b* into a plano-convex lens. Adjustable-focus lens 1060*a* may thereby cause an image displayed by display 1045 to appear closer to eye 1050. At the same time, adjustable-focus lens 1060*b* may compensate for the optical power created by adjustable-focus lens 1060*a* so that the appearance of tree 1055 is not significantly affected by the change to adjustable-focus lens 1060*a*.

As should be appreciated, in some examples intermediate positions of carriages 1030*a* and 1030*b* may result in intermediate changes to the apparent accommodation distance of images displayed by display 1045, allowing for a continuous range of possible apparent accommodation distances for virtual objects while maintaining the fidelity of the appearance of real-world objects.

In some embodiments, additional optical elements such as lens 1065*a* and lens 1065*b* may be included to provide additional optical power. In some embodiments, the lenses 1065*a* and 1065*b* may include prescription lenses that may be used to treat refractive errors of the eye, which may include, for example, myopia, hypermetropia, astigmatism, and presbyopia, and the like. In other embodiments, the prescription lenses may be customized to correct for a given user's refractive errors, which may include various components, such as a sphere component to address myopia and/or presbyopia, a cylinder component to address astigmatism, and a prism component to address strabismus and other binocular vision disorders.

Figure 11:
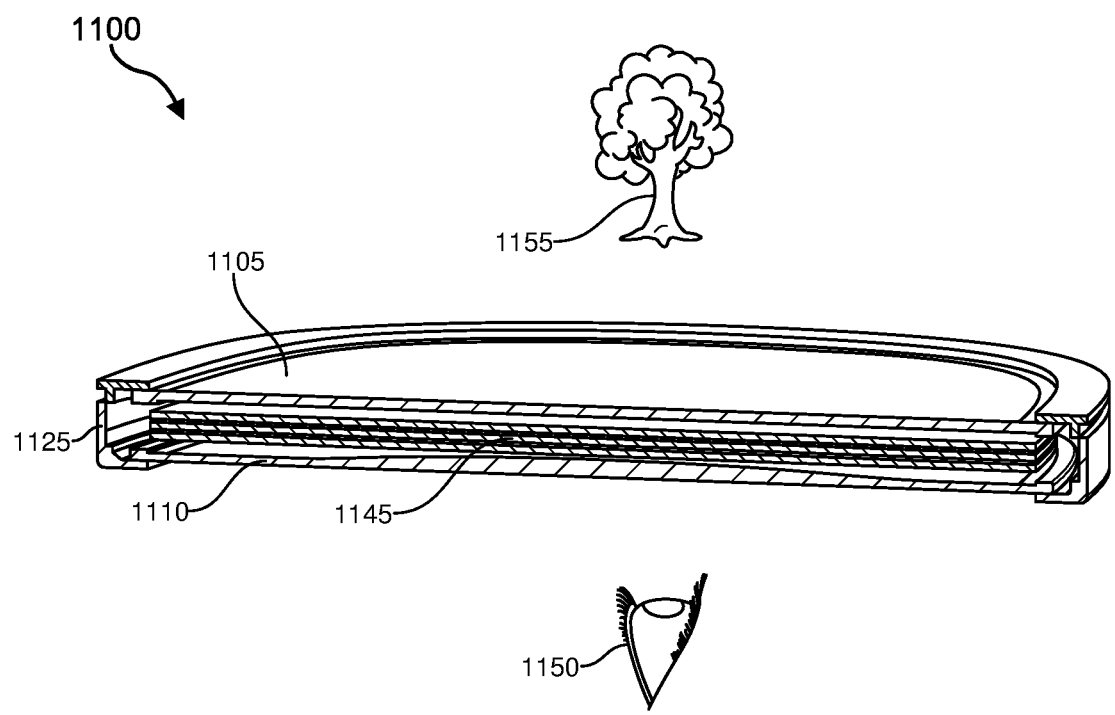
FIG. 11 shows a cross-sectional view of a lens-display assembly, in accordance with example embodiments of the disclosure.

FIG. 11 illustrates a cross-section of a lens-display assembly 1100, in accordance with at least one embodiment. As shown in FIG. 11, lens-display assembly 1100 may include an adjustable lens 1105, an adjustable lens 1110, a display 1145 positioned between adjustable lenses 1105 and 1110, and a lens assembly housing 1125. In some examples, the volume between lens assembly housing 1125 and display 1145 may provide space for electroactive devices (e.g., direct drive actuators) as described herein. According to some examples, the combination of adjustable lenses 1105 and 1110 may modify the apparent accommodation distance of images created by display 1145 without changing the appearance of distant real-world objects (e.g., tree 1155) as perceived by a user's eye 1150.

As shown in FIG. 12, a near-eye display system 1200 may include a near-eye display (NED) 1210 and a control system 1220, which may be communicatively coupled to each other, in accordance with example embodiments of the disclosure. In one embodiment, the near-eye display 1210 may include lenses 1212, electroactive devices 1214, displays 1216, and a sensor 1218. Control system 1220 may include a control element 1222, a force lookup table 1224, and augmented reality (AR) logic 1226.

Augmented reality logic 1226 may determine what virtual objects are to be displayed and real-world positions onto which the virtual objects are to be projected. Accordingly, augmented reality logic 1226 may generate an image stream 1228 that is displayed by displays 1216 in such a way that alignment of right- and left-side images displayed in displays 1216 results in ocular vergence toward a desired real-world position.

In another embodiment, the control element 1222 may use the same positioning information determined by augmented reality logic 1226, in combination with force lookup table (LUT) 1224, to determine an amount of force to be applied by electroactive devices 1214 (e.g., actuators), as described herein, to lenses 1212. Electroactive devices 1214 may, responsive to control element 1222, apply appropriate forces to lenses 1212 (e.g., as shown and described in connection with FIG. 1, above) to adjust the apparent accommodation distance of virtual images displayed in displays 1216 to match the apparent vergence distance of the virtual images, thereby reducing or eliminating vergence-accommodation conflict. Control element 1222 may be in communication with sensor 1218, which may measure a state of the adjustable lens. Based on data received from sensor 1218, the control element 1222 may adjust electroactive devices 1214 (e.g., as a closed-loop control system).

In some examples, display system 1200 may display multiple virtual objects at once and may determine which virtual object a user is viewing (or is likely to be viewing) to identify a virtual object for which to correct the apparent accommodation distance. For example, the system may include an eye tracking system (not shown) that provides information to control element 1222 to enable control element 1222 to select the position of the relevant virtual object.

Additionally or alternatively, augmented reality logic 1226 may provide information about which virtual object is the most important and/or most likely to draw the attention of the user (e.g., based on spatial or temporal proximity, movement, and/or a semantic importance metric attached to the virtual object). In some examples, the augmented reality logic 1226 may identify multiple potentially important virtual objects and select an apparent accommodation distance that approximates the virtual distance of a group of the potentially important virtual objects.

In various embodiments, the control system 1220 may represent any suitable hardware, software, or combination thereof for managing adjustments to adjustable lenses 1212. In some examples, control system 1220 may represent a system on a chip (SOC). As such, one or more portions of control system 1220 may include one or more hardware modules. Additionally or alternatively, one or more portions of control system 1220 may include one or more software modules that perform one or more of the tasks described herein when stored in the memory of a computing device and executed by a hardware processor of the computing device.

In another embodiment, the control system 1220 may generally represent any suitable system for providing display data, augmented reality data, and/or augmented reality logic for a head-mounted display. In some examples, control system 1220 may include a graphics processing unit (GPU) and/or any other type of hardware accelerator designed to optimize graphics processing.

FIG. 13 shows a diagram of an example head mounted device (HMD), in accordance with example embodiments of the disclosure. Control system 1220 may be implemented in various types of systems, such as the augmented reality glasses 1300 illustrated in FIG. 13. As shown, glasses 1300 may include adjustable-focus lenses 1310 coupled to a frame 1330 (e.g., at an eyewire, not shown). In some embodiments, control system 1220 of FIG. 12 may be integrated into frame 1330. Alternatively, all or a portion of control system 1220 may be in a system remote from glasses 1300 and configured to control electroactive devices (e.g., actuators) in glasses 1300 via wired or wireless communication.

In an embodiment, each of lenses 1310 may include, for example, an optical fluid encapsulated by an elastomeric membrane and an optically clear and rigid back substrate. Actuation along the perimeter of lenses 1310 (e.g., using one or more electroactive devices as further shown and described in connection with FIGS. 1, 3, and/or 4, above) may change the curvature (and thus the optical power) of the lenses, with positive and negative shapes determined by the direction of the applied force. In an embodiment, a membrane surface may be non-planar (e.g., concave or convex) at rest (e.g., at zero electrical power). In one example, a membrane surface may be non-planar when a substrate is curved.

Electroactive devices (e.g., actuators) mounted in frame 1330 (e.g., in an eyewire) may deform each lens, with high optical quality achieved through tailored displacement and deflection, and via perimeter mounting for an asymmetric clear aperture including, for example, an RGB (red-green-blue) waveguide.

As noted, control system 1220 of FIG. 12 may trigger electroactive devices to adjust lenses (e.g., lenses 1310) to help address the vergence-accommodation conflict. The vergence-accommodation conflict may result from how humans perceive depth. When a human eye fixates on an object, it accommodates to that object—that is, it changes focal distance to bring that object into focus. That accommodation is a visual cue to depth: objects that are much closer or further away than that distance is out of focus on the retina. This "retinal blur" may serve as a cue that objects are at a different distance than the accommodative distance, although the cue is ambiguous as to whether the objects are closer or more distant.

In some aspects, when a user uses both eyes (stereoscopically), binocular disparity may serve as the main visual cue for depth. In particular, the two eyes may look at an object from slightly different angles, so the different eyes may receive slightly different views of the object. This difference in views may be referred to as the binocular disparity (imperfect match) between the two views. The visual system normally fuses these two images into a single perception and may convert the disparity between the two images into a perception of depth. The closer an object is, the larger the disparity (error in matching) between the images it produces on the two retinas.

In some virtual reality head-mounted devices, a virtual display plane, or focal plane, may be located at a fixed distance. But virtual objects may be "located" either in front of or behind the focal plane. The head-mounted display may try to reproduce binocular disparity for such virtual objects, which is the main visual cue for depth. But the binocular disparity cue may drive the eyes to verge at one distance, while the light rays coming from the virtual plane may produce retinal blur that drives the eyes to accommodate to another distance, creating a conflict between those depth cues and forcing the viewer's brain to unnaturally adapt to conflicting cues. This vergence-accommodation conflict in turn creates visual fatigue, especially during prolonged use of an augmented reality system. In various embodiments, the electroactive devices described herein may be used to reduce the effect of such vergence-accommodation conflict and similar visual effects.

As noted, embodiments of the instant disclosure may include or be implemented in conjunction with an artificial reality system. Artificial reality is a form of reality that has been adjusted in some manner before presentation to a user, which, as noted, may include, e.g., a VR, an AR, a MR, a hybrid reality, or some combination and/or derivatives thereof. Artificial reality content may include completely generated content or generated content combined with captured (e.g., real-world) content. The artificial reality content may include video, audio, haptic feedback, or some combination thereof, any of which may be presented in a single channel or in multiple channels (such as stereo video that produces a three-dimensional effect to the viewer). Additionally, in some embodiments, artificial reality may also be associated with applications, products, accessories, services, or some combination thereof, that are used to, e.g., create content in an artificial reality and/or are otherwise used in (e.g., perform activities in) an artificial reality. The artificial reality system that provides the artificial reality content may be implemented on various platforms, including a HMD connected to a host computer system, a standalone HMD, a mobile device or computing system, or any other hardware platform capable of providing artificial reality content to one or more viewers.

The process parameters and sequence of the steps described and/or illustrated herein are given by way of example only and may be varied as desired. For example, while the steps illustrated and/or described herein may be shown or discussed in a particular order, these steps do not necessarily need to be performed in the order illustrated or discussed. The various exemplary methods described and/or illustrated herein may also omit one or more of the steps described or illustrated herein or include additional steps in addition to those disclosed.

The preceding description has been provided to enable others skilled in the art to best utilize various aspects of the exemplary embodiments disclosed herein. This exemplary description is not intended to be exhaustive or to be limited to any precise form disclosed. Many modifications and variations are possible without departing from the spirit and scope of the instant disclosure. The embodiments disclosed herein should be considered in all respects illustrative and not restrictive. Reference should be made to the appended claims and their equivalents in determining the scope of the instant disclosure.

Unless otherwise noted, the terms "connected to" and "coupled to" (and their derivatives), as used in the specification and claims, are to be construed as permitting both direct and indirect (i.e., via other elements or components) connection. In addition, the terms "a" or "an," as used in the specification and claims, are to be construed as meaning "at least one of." Finally, for ease of use, the terms "including" and "having" (and their derivatives), as used in the specification and claims, are interchangeable with and have the same meaning as the word "comprising."

What is claimed is:

1. A method, comprising:
   applying, by a voltage source, a first voltage and a first current to an electroactive device comprising a nanovoided electroactive polymer positioned between two electrodes, the electroactive polymer comprising a dielectric elastomer that is deformable in the presence of an electrostatic field generated between the two electrodes;
   measuring, by a controller, a second voltage and a second current received from the electroactive device;
   determining, by the controller, at least one of a positional relationship between the two electrodes or a force output of the electroactive device based on the second voltage and the second current; and
   applying, by the voltage source, a third voltage and a third current to the electroactive device based on the at least one of the positional relationship between the two electrodes or the force output of the electroactive device, wherein the third voltage and the third current are different than the first voltage and the first current.

2. The method of claim 1, wherein determining at least one of the positional relationship between the two electrodes or the force output of the electroactive device further comprises determining, by the controller, a capacitance associated with the electroactive device based on the second voltage and the second current.

3. The method of claim 1, wherein determining at least one of the positional relationship between the two electrodes or the force output of the electroactive device further comprises determining, by the controller, a parallel resistance or a series resistance associated with the electroactive device based on the second voltage and the second current.

4. The method of claim 1, further comprising:
   determining, by the controller, an error value associated with the positional relationship or the force output;
   determining, by the controller, at least one of a first signal proportional to the error value, a second signal based on an integral of the error value, or a third signal based on a derivative of the error value; and
   applying, by the voltage source, the third voltage and the third current based on at least one of the first signal, the second signal, or the third signal.

5. The method of claim 1, wherein the electroactive device comprises a dielectric elastomer actuator.

6. The method of claim 1, wherein a first electrode of the two electrodes is adjacent to a first surface of the nanovoided electroactive polymer and a second electrode of the two electrodes is adjacent to a second surface of the nanovoided electroactive polymer.

7. The method of claim 1, wherein the nanovoided electroactive polymer comprises a concentration of the nanovoids per unit volume that is approximately 10% to approximately 90%.

8. The method of claim 1, wherein the nanovoided electroactive polymer comprises at least one of a polymer or an oxide.

9. A method, comprising:
   applying, by a voltage source, a first voltage and a first current to an electroactive device comprising a nanovoided electroactive polymer positioned between two electrodes, the electroactive polymer comprising a dielectric elastomer that is deformable in the presence of an electrostatic field generated between the two electrodes;
   determining, by a controller, at least one of a positional relationship between the two electrodes or a force output of the electroactive device based on a second voltage and a second current output by the electroactive device; and
   applying, by the voltage source, a third voltage and a third current to the electroactive device based on the at least one of the positional relationship between the two electrodes or the force output of the electroactive device, wherein the third voltage and the third current are different than the first voltage and the first current.

10. The method of claim 9, wherein determining the at least one of the positional relationship between the two electrodes or the force output of the electroactive device further comprises:
    determining, by the controller, the second voltage and the second current based on measurements by a piezoelectric device electrically coupled to the electroactive device in circuit configuration having feedback.

11. The method of claim 9, further comprising:
    determining, by the controller, an error value associated with the positional relationship or the force output;
    determining, by the controller, at least one of a first signal proportional to the error value, a second signal based on an integral of the error value, or a third signal based on a derivative of the error value; and
    applying, by the voltage source, the third voltage and the third current to the electroactive device based on at least one of the first signal, the second signal, or the third signal.

12. The method of claim 9, wherein the electroactive device comprises a dielectric elastomer actuator.

13. The method of claim 9, wherein a first electrode of the two electrodes is adjacent to a first surface of the nanovoided electroactive polymer and a second electrode of the two electrodes is adjacent to a second surface of the nanovoided electroactive polymer.

14. The method of claim 9, wherein the nanovoided electroactive polymer comprises a concentration of the nanovoids per unit volume that is approximately 10% to approximately 90%.

15. The method of claim 9, wherein the nanovoided electroactive polymer comprises at least one of a polymer or an oxide.

16. A system, comprising:
- an electroactive device comprising a nanovoided electroactive polymer positioned between two electrodes, the electroactive polymer comprising a dielectric elastomer that is deformable in the presence of an electrostatic field generated between the two electrodes; and
- a circuit comprising a voltage source and a controller, wherein the circuit is configured to:
  - apply, by the voltage source, a first voltage and a first current to the electroactive device;
  - measure, by the controller, a second voltage and a second current received from the electroactive device;
  - determine, by the controller, at least one of a positional relationship between the two electrodes or a force output of the electroactive device based on the second voltage and the second current; and
  - apply, by the voltage source, a third voltage and a third current to the electroactive device based on the at least one of the positional relationship between the two electrodes or the force output of the electroactive device, wherein the third voltage and the third current are different than the first voltage and the first current.

17. The system of claim 16, wherein the circuit being configured to determine the at least one of the positional relationship between the two electrodes or the force output of the electroactive device further comprises the circuit being configured to determine, by the controller, a capacitance associated with the electroactive device based on the second voltage and the second current.

18. The system of claim 16, wherein the electroactive device comprises a dielectric elastomer actuator.

19. The system of claim 16, wherein a first electrode of the two electrodes is adjacent to a first surface of the nanovoided electroactive polymer and a second electrode of the two electrodes is adjacent to a second surface of the nanovoided electroactive polymer.

20. The system of claim 16, wherein the nanovoided electroactive polymer comprises a concentration of the nanovoids per unit volume that is approximately 10% to approximately 90%.

* * * * *